US012581810B2

(12) United States Patent
Na et al.

(10) Patent No.: US 12,581,810 B2
(45) Date of Patent: Mar. 17, 2026

(54) ORGANIC LIGHT EMITTING DIODE DISPLAY DEVICE AND MANUFACTURING METHOD THEREOF

(71) Applicant: LG Display Co., Ltd., Seoul (KR)

(72) Inventors: Hyunseok Na, Paju-si (KR); Pyungho Choi, Seoul (KR); Hyoungsun Park, Seoul (KR); JaeJun Ahn, Gumi-si (KR); ChangSuk Hyun, Paju-si (KR); Jaegeun Kim, Seoul (KR); Seongsoo Cho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 369 days.

(21) Appl. No.: 18/165,300

(22) Filed: Feb. 6, 2023

(65) Prior Publication Data

US 2023/0284487 A1 Sep. 7, 2023

(30) Foreign Application Priority Data

Mar. 2, 2022 (KR) ........................ 10-2022-0026589

(51) Int. Cl.
*H10K 59/126* (2023.01)
*H10K 59/12* (2023.01)

(52) U.S. Cl.
CPC ....... *H10K 59/126* (2023.02); *H10K 59/1201* (2023.02)

(58) Field of Classification Search
CPC ............. H10K 59/126; H10K 59/1201; H10K 59/1213; H10K 59/131; H10K 59/1216;
(Continued)

(56) References Cited

U.S. PATENT DOCUMENTS

2015/0055051 A1 2/2015 Osawa et al.
2016/0049426 A1 2/2016 Lim et al.
(Continued)

FOREIGN PATENT DOCUMENTS

KR 10-2015-0101409 A 9/2015
KR 10-2016-0018825 A 2/2016
(Continued)

OTHER PUBLICATIONS

Korean Intellectual Property Office, Office Action, Korean Patent Application No. 10-2022-0026589, Jul. 31, 2025, 13 pages.
(Continued)

*Primary Examiner* — Cuong B Nguyen
(74) *Attorney, Agent, or Firm* — Fenwick & West LLP

(57) ABSTRACT

An organic light emitting display device including both a polycrystalline semiconductor element and an oxide semiconductor element, and a method of manufacturing the display device are disclosed. In order to solve the damage of an oxide semiconductor pattern during a heat treatment process in the process of forming the oxide semiconductor element, until the process of forming the polycrystalline semiconductor element is completed, after one portion of a connection electrode connecting a polycrystalline semiconductor pattern to source and drain electrodes is formed in advance, then by forming the other portion of the connection electrode for completing the connection between the source and drain electrodes to the polycrystalline semiconductor pattern in the process of forming the oxide semiconductor element, the connection electrode can have a connection node between two edges thereof, and thereby, the performance of the oxide semiconductor element can be improved.

22 Claims, 12 Drawing Sheets

(58) Field of Classification Search
CPC .. H10K 59/124; H10K 71/00; H10D 30/6723;
H10D 86/423; H10D 86/441; H10D
86/60; H10D 86/481; H10D 86/40; H10D
86/021; G09G 2300/0426; G09G
2300/0861; G09G 2310/08; G09G 3/3233
See application file for complete search history.

(56) References Cited

U.S. PATENT DOCUMENTS

| | | | |
|---|---|---|---|
| 2021/0036029 A1 | 2/2021 | Park et al. | |
| 2022/0005904 A1 | 1/2022 | Moon et al. | |
| 2022/0384547 A1* | 12/2022 | Lee ..................... | H10K 50/865 |
| 2023/0238389 A1* | 7/2023 | Gong .................. | H10K 59/123 |
| | | | 257/43 |
| 2024/0257686 A1 | 8/2024 | Choi | |

FOREIGN PATENT DOCUMENTS

| | | | |
|---|---|---|---|
| KR | 10-2016-0021329 A | 2/2016 | |
| KR | 10-2021-0016114 A | 2/2021 | |
| KR | 10-2021-0086274 A | 7/2021 | |
| KR | 10-2021-0086276 A | 7/2021 | |
| KR | 10-2021-0086472 A | 7/2021 | |
| KR | 10-2022-0005180 A | 1/2022 | |

OTHER PUBLICATIONS

Ministry of Intellectual Property of Korea, Notice of Allowance, Korean Patent Application No. 10-2022-0026589, Jan. 30, 2026, five pages.

* cited by examiner

ORGANIC LIGHT EMITTING DIODE DISPLAY DEVICE AND MANUFACTURING METHOD THEREOF

CROSS-REFERENCE TO RELATED APPLICATION

This application claims the priority benefit of Republic of Korea Patent Application No. 10-2022-0026589, filed on Mar. 2, 2022 in the Korean Intellectual Property Office, which is hereby incorporated by reference in its entirety.

BACKGROUND

Technical Field

The present disclosure relates to display devices, and more particularly, to organic light emitting display devices including hybrid thin film transistors formed using different types of semiconductor materials in forming a plurality of thin film transistors included in a pixel circuit part of a unit pixel. In particular, the present disclosure relates to organic light emitting display devices capable of representing a wide range of grayscale images and realizing fast on-off operation by adjusting the S-factor of at least one specific thin film transistor among the plurality of thin film transistors, and to a method of manufacturing the organic light emitting display device for preventing the degradation of at least one thin film transistor including an oxide semiconductor pattern.

Description of the Related Art

Recently, with the development of multimedia, flat panel display devices have increasingly become important. To meet demands for a variety of display devices, flat panel display devices such as a liquid crystal display device, a plasma display device, an organic light emitting display device, and the like have been developed and commercialized. The organic light emitting display device has advantages over other flat panel display devices, such as faster response speed, higher luminous efficiency, wider viewing angle, and the like, and thus, is becoming increasingly popular.

In such an organic light emitting display device, a plurality of pixels may be arranged in a matrix pattern, and each pixel may include a light emitting element part represented by an organic emission layer and a pixel circuit part represented by at least one thin film transistor. The pixel circuit part may include a plurality of thin film transistors (TFT) such as a driving TFT for supplying a driving current to operate the light emitting element part and a switching TFT for supplying a gate signal to the driving TFT, and the like.

Further, a gate driver for providing a gate signal to a pixel may be disposed in a non-display area of the organic light emitting display device.

As described above, since a plurality of thin film transistors disposed in the pixel circuit part of a pixel, for example, a subpixel, and the gate driver can perform different functions, therefore, electrical characteristics thereof may be required to be different from one another. In order for a plurality of thin film transistors disposed in a pixel to have different electrical characteristics, for example, the plurality of thin film transistors may be configured to have different structures or include different semiconductor materials. In this example, such semiconductor material layers may be needed to be formed in different layers, and may be exposed in different etching conditions in an etching process, and thereby, the quality and reliability of oxide semiconductor materials may become poor during a heat treatment process.

SUMMARY

One or more example embodiments of the present disclosure may provide an organic light emitting display device capable of improving the performance of both a polycrystalline semiconductor pattern and an oxide semiconductor pattern, reducing or preventing leakage current, and representing a variety of grayscale images at low grayscales, considering that the polycrystalline semiconductor pattern and the oxide semiconductor pattern located in different layers in each pixel are differently influenced by hydrogen particles.

According to aspects of present disclosure, an organic light emitting display device is provided that includes: a substrate including a display area and a non-display area located outside of the display area; a first thin film transistor disposed over the substrate, and including a first semiconductor pattern, a first gate electrode overlapping the first semiconductor pattern, and first source and drain electrodes connected to the first semiconductor pattern through a plurality of interposed insulating layers; a second thin film transistor disposed over the substrate, and including a second semiconductor pattern disposed in a layer different from the first semiconductor pattern, a second gate electrode overlapping the second semiconductor pattern, second source and drain electrodes connected to the second semiconductor pattern, and a second light shield pattern located under the second semiconductor pattern, overlapping the second semiconductor pattern, and connected to one of the second source electrode and the second drain electrode; a third thin film transistor disposed over the substrate, and including a third semiconductor pattern disposed in the same layer as the second semiconductor pattern, a third gate electrode overlapping the third semiconductor pattern, third source and drain electrodes connected to the third semiconductor pattern, and a third light shield pattern located under the third semiconductor pattern and overlapping the third semiconductor pattern, wherein a vertical distance between the second light shield pattern and the second semiconductor pattern may be shorter than a vertical distance between the third light shield pattern and the third semiconductor pattern, and the first source electrode and the first drain electrode may pass through the plurality of insulating layers and be connected by a first connection electrode including at least one connection node.

The first semiconductor pattern may include a polycrystalline semiconductor pattern, and the second semiconductor pattern and the third semiconductor pattern may include an oxide semiconductor pattern.

The first thin film transistor may be disposed in any one of the display area and the non-display area, and the second thin film transistor and the third thin film transistor may be disposed in the display area.

The second thin film transistor may be a driving thin film transistor disposed in a subpixel, and the third thin film transistor may be a switching thin film transistor disposed in the subpixel.

The plurality of insulating layers may include a first gate insulating layer disposed between the first semiconductor pattern and the first gate electrode, at least one intermediate insulating layer disposed between the first gate electrode and an upper buffer layer, the upper buffer layer between the intermediate insulating layer and the second semiconductor pattern, a second gate insulating layer between the second semiconductor pattern and the second gate electrode, and an interlayer insulating layer between the second gate electrode and the second source and drain electrodes.

The second light shield pattern may be located inside of the upper buffer layer, and the third light shield pattern may be located under the upper buffer layer.

The upper buffer layer may include a plurality of sub-buffer layers, and the second light shield pattern may be disposed between the sub-buffer layers.

A first connection line may include a connection node between the upper buffer layer and the second gate insulating layer.

The first connection line may include a same material as the first source electrode and the second drain electrode.

Different conductors may respectively ohmically contact upper and lower portions of the first connection line based on the connection node.

The second source electrode and the second drain electrode may be connected to the second semiconductor pattern. For example, the second source electrode and the second drain electrode may be connected to the second semiconductor pattern through a second connection electrode formed as a single body.

The organic light emitting display device may further include at least one lower buffer layer on the substrate, and a first light shield pattern may be further disposed between the substrate and the first semiconductor pattern.

The at least one intermediate insulating layer may include a silicon nitride layer.

According to aspects of the present disclosure, a method of manufacturing an organic light emitting display device is provided that includes: preparing a substrate including a display area and a non-display area; forming a first semiconductor pattern on at least one lower buffer layer located on the substrate; forming a first gate insulating layer on the first semiconductor pattern; forming a first gate electrode on the first gate insulating layer; forming at least one intermediate insulating layer on the first gate electrode; forming an upper buffer layer including a second light shield pattern on the at least one intermediate insulating layer; forming a first part of a first contact hole that passes through the upper buffer layer, the at least one intermediate insulating layer, and the first gate insulating layer, and exposes a portion of the first semiconductor pattern; forming a first part of a first connection electrode connected to the first semiconductor pattern through the first part of the first contact hole; forming a second semiconductor pattern on the upper buffer layer; forming a second gate electrode on a second gate insulating layer located on the second semiconductor pattern, the second gate electrode overlapping the second semiconductor pattern; forming an interlayer insulating layer on the second gate electrode; forming a second part of the first contact hole that passes through the interlayer insulating layer and the second gate insulating layer and exposes the first part of the first connection electrode; and forming a second part of the first connection electrode connected to the first part of the first connection electrode through a second part of a second contact hole.

In the process of forming the first semiconductor pattern on the at least one lower buffer layer located on the substrate, a first light shield pattern overlapping the first semiconductor pattern over the substrate may be formed.

The lower buffer layer may include a first lower buffer layer disposed between the substrate and the first light shield pattern and a second lower buffer layer disposed between the first light shield pattern and the first semiconductor pattern.

In the process of forming the second semiconductor pattern on the upper buffer layer, a third semiconductor pattern including the same material as the second semiconductor pattern may be further formed on the upper buffer layer.

In the process of forming the first gate electrode on the first gate insulating layer, a third light shield pattern overlapping the third semiconductor pattern and a first electrode of a storage capacitor may be further formed.

The method may further include forming a second electrode of the storage capacitor overlapping the first electrode of the storage capacitor between the first gate electrode and the upper buffer layer.

In the process of forming the upper buffer layer including the second light shield pattern on the intermediate insulating layer, the second electrode of the storage capacitor overlapping the first electrode of the storage capacitor may be further formed.

In the process of forming the first part of the first contact hole that passes through the upper buffer layer, the at least one intermediate insulating layer, and the first gate insulating layer, and exposes the portion of the first semiconductor pattern, the upper buffer layer deposited in the non-display area, and inorganic insulating layers disposed between the upper buffer layer and the substrate may be removed together.

In the process of forming the second part of the first connection electrode connected to the first part of the first connection electrode through the second part of the second contact hole, first source and drain electrodes connected to the second part of the first connection electrode, and second source and drain electrodes connected to the second semiconductor pattern may be formed together.

In the process of forming the second part of the first contact hole that passes the interlayer insulating layer and the second gate insulating layer, and exposes the first part of the first connection electrode, the interlayer insulating layer and the second gate insulating layer located in the non-display area of the substrate may be removed together.

According to one or more example embodiments of the present disclosure, an organic light emitting display device can be provided that is capable of reducing or preventing leakage current and thereby realizing low power consumption by implementing a pixel circuit part including both a polycrystalline semiconductor element and an oxide semiconductor element. According to one or more example embodiments of the present disclosure, an organic light emitting display device can be provided that is capable of representing a variety of grayscale images at low grayscales by allowing a driving thin film transistor of a pixel to include an oxide semiconductor device having a large S-factor. According to one or more example embodiments of the present disclosure, an organic light emitting display device can be provided that is capable of preventing or reducing the damage of an oxide semiconductor pattern during a heat treatment process, and thereby improving the reliability of corresponding oxide semiconductor element, as a polycrystalline semiconductor pattern and a portion of the connection electrode connecting the polycrystalline semiconductor pattern and source and drain electrodes are formed in advance before the oxide semiconductor pattern is formed, and then the oxide semiconductor pattern is formed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION

Figure 1A:
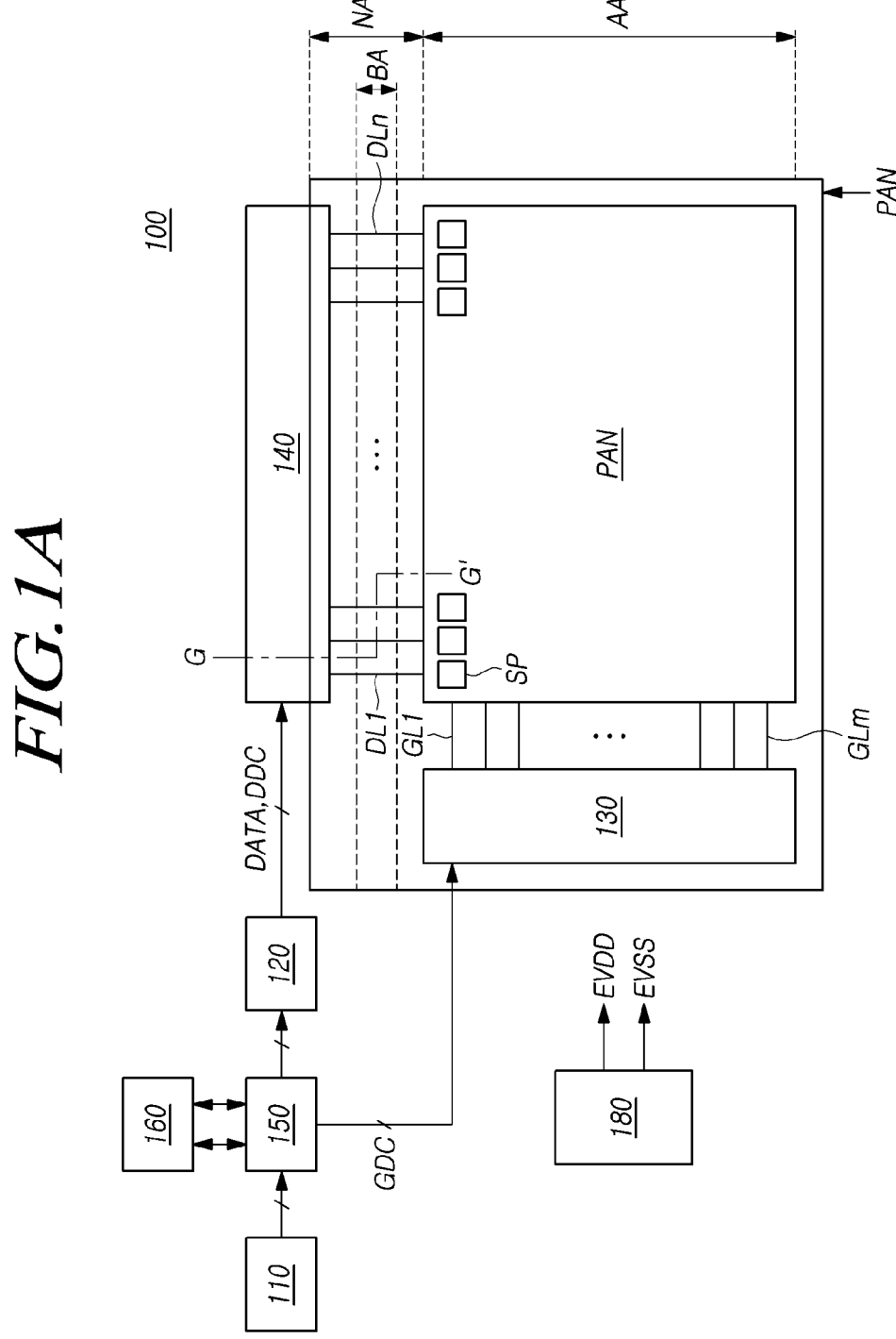
FIG. 1A illustrates an example organic light emitting display device according to one embodiment of the present disclosure.

Reference will now be made in detail to embodiments of the present disclosure, examples of which may be illustrated in the accompanying drawings. Advantages and features of the present disclosure, and implementation methods thereof will be clarified through following example embodiments described with reference to the accompanying drawings. In the following description, the structures, embodiments, implementations, methods and operations described herein are not limited to the specific example set forth herein and may be changed as is known in the art, unless otherwise specified. The present disclosure may be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals designate like elements throughout, unless otherwise specified. Names of the respective elements used in the following explanations are selected only for convenience of writing the specification and may thus be different from those used in actual products. In the following description, where the detailed description of the relevant known function or configuration may unnecessarily obscure aspects of the present disclosure, a detailed description of such known function or configuration may be omitted. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise. Singular forms used herein are intended to include plural forms unless the context clearly indicates otherwise.

In construing an element, the element is to be construed as including an error or tolerance range even where no explicit description of such an error or tolerance range is provided. Further, the term "may" fully encompasses all the meanings of the term "can."

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference.

In describing a temporal relationship, when the temporal order is described as, for example, "after," "subsequent," "next," or "before," a case which is not continuous may be included unless a more limiting term, such as "just," "immediate(ly)," or "direct(ly)," is used. The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

The expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified. For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers "disposed" or "interposed" between the elements or layers, unless otherwise specified.

Hereinafter, examples and embodiments according to aspects of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

Figure 1B:
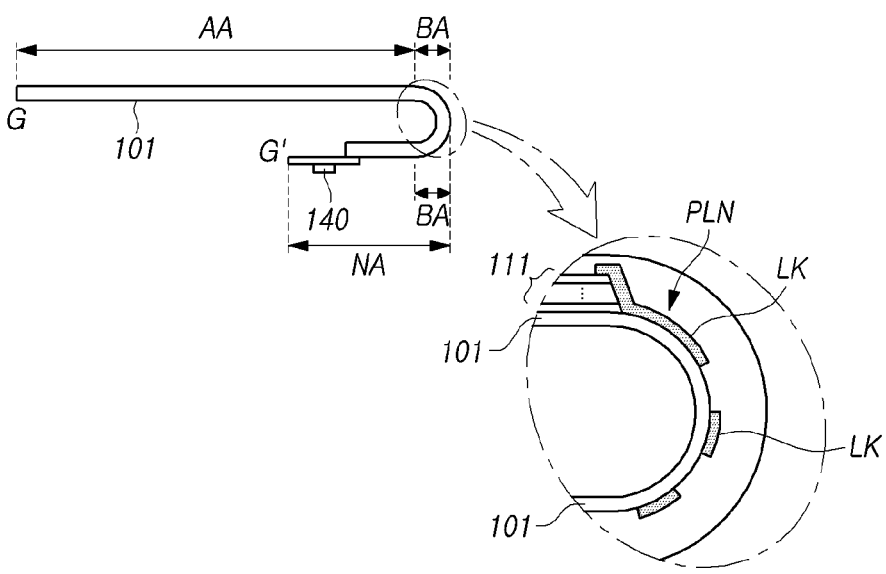
FIG. 1B is an example cross-sectional view of the display device taken along line "G-G" in FIG. 1A according to one embodiment of the present disclosure.
Figure 2:
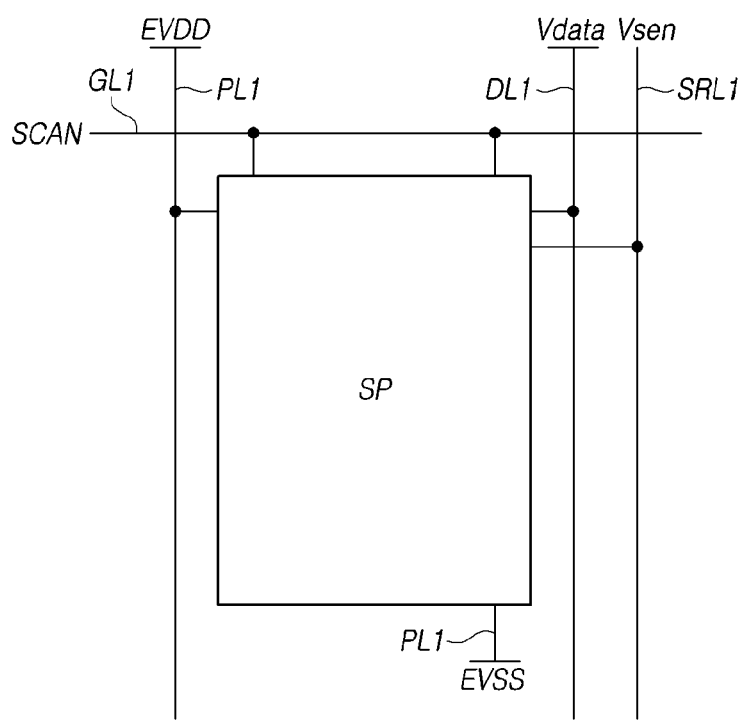
FIG. 2 illustrates an example subpixel of the organic light emitting display device according to one embodiment of the present disclosure.

FIG. 1A is a schematic block diagram of an example organic light emitting display device 100 according to embodiments of the present disclosure, and FIG. 1B is an example cross-sectional view of the organic light emitting display device 100 taken along line "G-G" in FIG. 1A according to one embodiment of the present disclosure. FIG. 2 is a schematic block diagram of an example subpixel illustrated in FIG. 1A according to one embodiment of the present disclosure.

As illustrated in FIG. 1A, the organic light emitting display device 100 may include an image processor 110, a degradation compensator 150, a memory 160, a timing controller 120, a data driver 140, a power supply 180, and a display panel PAN in which a gate driver 130 is disposed. The display panel PAN may include a display area AA and a non-display area NA. In some embodiments, the non-display area NA of the display panel PAN may include a bending area BA. The display panel PAN can be folded or bent in the bending area BA, and thus, a bezel of the display panel PAN may be reduced.

The image processor 110 can output driving or control signals for driving or controlling various elements or devices, as well as image data received from an external image data providing source. For example, such driving signals output from the image processor 110 may include a data enable signal, a vertical synchronization signal, a horizontal synchronization signal, a clock signal, and the like.

The degradation compensator 150 (e.g., a circuit) can calculate degradation compensation gain values of subpixels SP of the display panel based on sensing voltages Vsen received from the data driver 140, and calculate dimming weight values based on the degradation compensation gain values. Thereafter, the degradation compensator 150 can modulate input image data Idata of each subpixel SP in a current frame using the degradation compensation gain values and the dimming weight values, and supply image data Mdata resulting from the modulation to the timing controller 120.

The timing controller 120 can receive a driving signal and the like, in addition to the modulated image data from the degradation compensator 150. The timing controller 120 can generate and provide a gate timing control signal GDC for controlling an operation timing of the gate driver 130 and a data timing control signal DDC for controlling an operation timing of the data driver 140 based on one or more driving signals provided by the image processor 110.

The timing controller 120 can cause at least one sensing voltage Vsen from at least one subpixel SP to be acquired and to be supplied to the degradation compensator 150 by controlling operation timings of the gate driver 130 and the data driver 140.

The gate driver 130 can output one or more scan signals to the display panel PAN in response to a gate timing control signal GDC supplied by the timing controller 120. The gate driver 130 can output one or more scan signals through a plurality of gate lines GL1 to GLm. In an embodiment, the gate driver 130 may be implemented in the form of an integrated circuit (IC). However, embodiments of the present disclosure are not limited thereto. In particular, the gate driver 130 may be implemented in a gate in panel (GIP) structure in which one or more thin film transistors are directly stacked on a substrate inside of the organic light emitting display device 100. The gate driver 130 implemented in the GIP structure may include a plurality of circuit elements such as a shift register, a level shifter, and the like.

The data driver 140 can output one or more data voltages to the display panel PAN in response to a data timing control signal DDC supplied by the timing controller 120. The data driver 140 can sample and latch a digital data signal DATA received from the timing controller 120, and converts the digital data signal DATA into an analog data voltage based on a gamma voltage.

The data driver 140 can output one or more data voltages through a plurality of data lines DL1 to DLn.

The data driver 140 can supply a sensing voltage Vsen received from the display panel PAN to the degradation compensator 150 through a sensing voltage readout line.

In an embodiment, the data driver 140 may be mounted on an upper surface of the display panel PAN in the form of an integrated circuit (IC) or may be directly disposed in the display panel PAN; however, embodiments of the present disclosure are not limited thereto.

The power supply 180 can output a high level driving voltage EVDD and a low level driving voltage EVSS to be supplied to the display panel PAN. The high level driving voltage VDD and the low level driving voltage EVSS may be supplied to the display panel PAN through one or more power supply lines. In an embodiment, the power supply 180 can supply voltages to the data driver 140 or the gate driver 130 for enabling the data driver 140 or the gate driver 130 to be driven.

The display panel PAN can display images based on data voltages and scan signals supplied from the data driver 140 and the gate driver 130 that may be disposed in the non-display area NA, and power such as voltages supplied from the power supply 180.

The display area AA of the display panel PAN may include a plurality of subpixels SP for displaying images. The plurality of subpixels SP may include one or more red subpixels, one or more green subpixels, and one or more blue subpixels, or include one or more white subpixels, one or more red subpixels, one or more green subpixels, and one or more blue subpixels. In an embodiment, all of the white subpixel, the red subpixel, the green subpixel and the blue subpixel may have a same area or size, or may have different areas or sizes.

The memory 160 may store a lookup table for degradation compensation gains and degradation compensation times of organic light emitting elements such as organic light emitting diodes of subpixels SP. For example, the degradation compensation times of the organic light emitting elements may be one or more times at which the organic light emitting display panel is driven, or the number of times that the organic light emitting display panel is driven.

In an embodiment, the non-display area NA may include a bending area BA in which the display panel PAN can be bent or folded. The bending area BA may be an area in that a signal pad (not shown), the gate driver 130, the data driver 140, and the like are located, and the function of displaying images is not performed, and be folded or bent toward the rear surface of the active area AA. The bending area BA may be located between the active area AA and the data driver 140 as illustrated in FIG. 1A. In an embodiment, the bending area BA may be disposed in at least one of the top, bottom, left, and right edges of the non-display area NA. Accordingly, an area occupied by the active area AA in the entire area of the display panel may be maximized, and the non-display area NA may be hidden behind the display area AA.

A signal link LK disposed in the bending area BA can connect a signal line disposed in the active area AA to a signal pad. The signal link LK may extend (e.g., the area thereof becomes greater) in a direction crossing a bending direction in which the bending area BA is folded or bent, and thereby, can enable bending stress to be reduced.

Figure 4A:
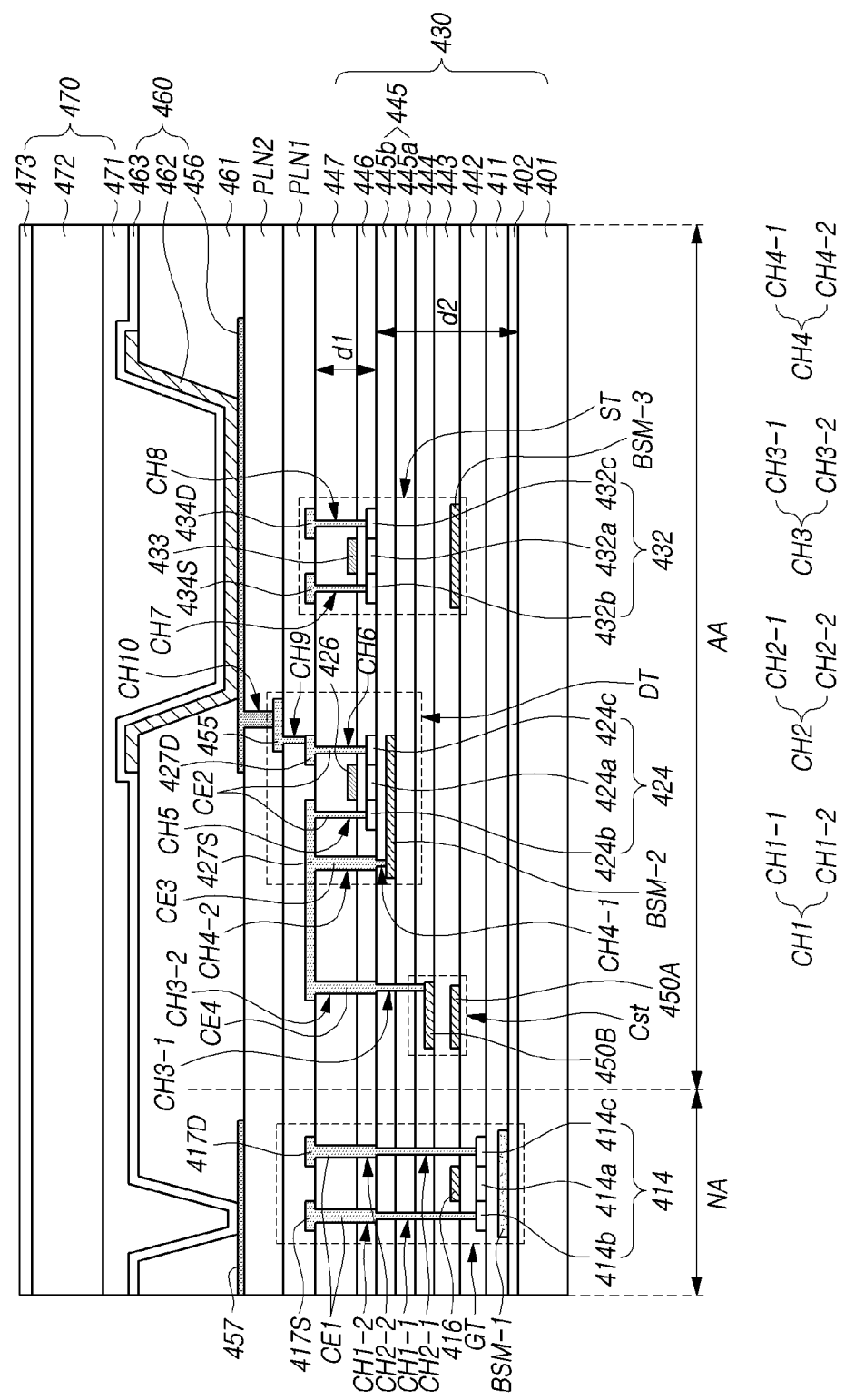
FIG. 4A is an example cross-sectional view of a thin film transistor disposed in a gate driver in a non-display area, and a driving thin film transistor and a switching thin film transistor disposed in a display area, of the organic light emitting display device according to one embodiment of the present disclosure.
Figure 4B:
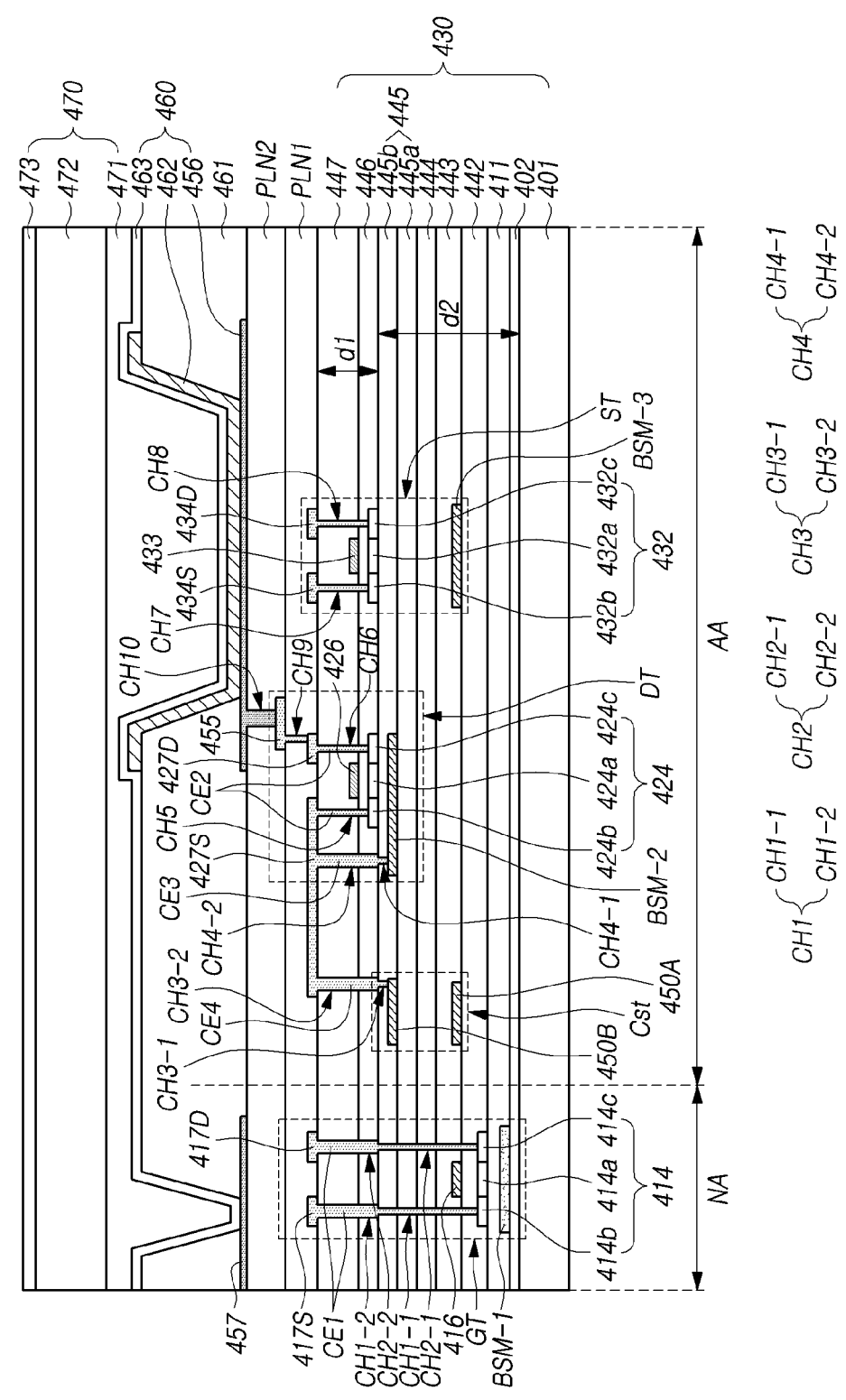
FIG. 4B is an example cross-sectional view in which a storage capacitor is configured differently from a storage capacitor in the embodiment of FIG. 4A in the organic light emitting display device according to one embodiment of the present disclosure.
Figure 4C:
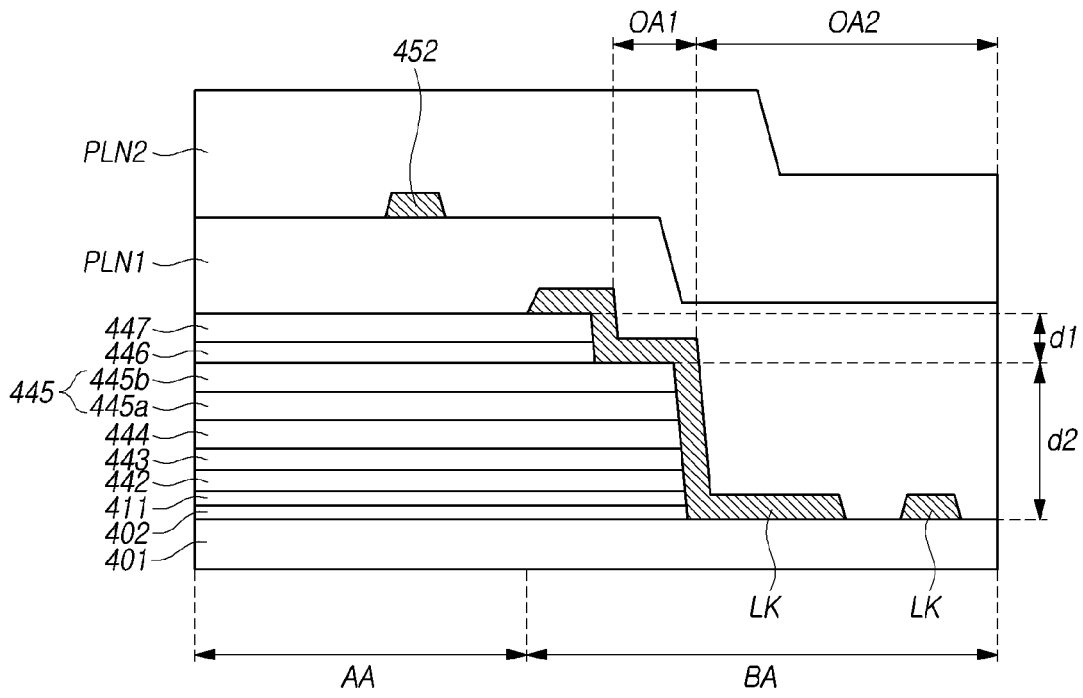
FIG. 4C is an example cross-sectional view of a bending area that is a part of the non-display area in the embodiment of FIG. 4A in the organic light emitting display device according to one embodiment of the present disclosure.

As illustrated in FIGS. 1B and 4C, at least one opened portion (OA1 and/or OA2) may be disposed in the bending area BA so that the bending area BA can be easily folded or bent. The at least one opened portion (OA1 and/or OA2) may be formed by removing at least respective parts of a plurality of inorganic insulating layers 111 (shown in FIG. 1B) that may be disposed in the bending area BA and cause a crack. Specifically, when the substrate 101 is bent, continuous bending stress may be applied to at least one inorganic insulating layer 111 disposed in the bending area BA. Since the inorganic insulating layer 111 has an elastic force lower than an organic insulating material, a crack may easily develop in the inorganic insulating layer 111.

A crack having developed in the inorganic insulating layer 111 may run into the active area AA along the inorganic insulating layer 111, and the crack may cause a line defect and/or cause the driving of an associated element or device to fail. Accordingly, in an embodiment, at least one planarization layer PLN including an organic insulating material having a greater elasticity than the inorganic insulating layer 111 may be disposed in the bending area BA. The planarization layer PLN can relieve bending stress generating while the substrate 101 is bent or folded, and thereby, prevent or at least reduce cracks from developing. Since at least one opened portion (OA1 and/or OA2) of the bending area BA may be formed through a same mask process as at least one of a plurality of contact holes disposed in the active area AA, thereby, the structure of, and the process of forming, the at least one opened portion (OA1 and/or OA2) may be simplified. According to embodiments of the present disclose, a new structure of the display device is provided that is capable of solving damage of a semiconductor pattern when at least one opened portion (OA1 and/or OA2) of the bending area BA and at least one contact hole of the display area are formed. This structure will be described in detail with reference to FIGS. 4A to 4C.

In some embodiments, as illustrated in FIG. 2, one subpixel SP may be connected with a gate line GL1, a data line DL1, a sensing voltage readout line SRL1, and a power supply line PL1. The number of transistors and capacitors included in a subpixel SP as well as a driving method of the subpixel SP may vary depending on considerations for designing a circuit of the subpixel SP.

Figure 3:
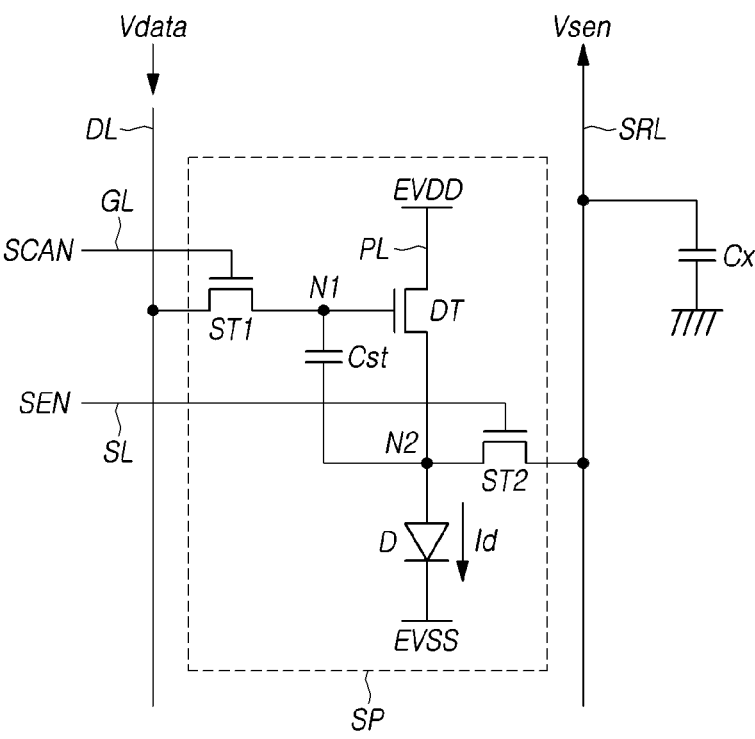
FIG. 3 is an example circuit diagram of the subpixel of the organic light emitting display device according to one embodiment of the present disclosure.

FIG. 3 is an example circuit diagram of a subpixel SP of the organic light emitting display device 100 according to one embodiment of the present disclosure.

As illustrated in FIG. 3, the organic light emitting display device 100 according to one embodiment of the present disclosure may include gate lines GL and data lines DL defining subpixels SP by being arranged in a manner of crossing each other, power supply lines PL, and sensing lines SL, and include a driving thin film transistor DT, an organic light emitting element D such as an organic light emitting diode, a storage capacitor Cst, a first switching thin film transistor ST, and a second switching thin film transistor ST2, which are included in the subpixel SP.

The organic light emitting element D may include an anode electrode connected to a second node N2, a cathode electrode connected to a low level voltage supply line, or a terminal of a low level voltage supply, for supplying a low level driving voltage EVSS, and an organic emission layer located between the anode electrode and the cathode electrode.

The driving thin film transistor DT can control a current Id flowing through the organic light emitting element D according to a gate-source voltage Vgs. The driving thin film transistor DT may include a gate electrode connected to a first node N1, a drain electrode connected to a power supply line PL, to which a high level driving voltage EVDD is applied, and a source electrode connected to the second node N2.

The storage capacitor Cst may be connected between the first node N1 and the second node N2.

The first switching thin film transistor ST1 can apply a data voltage Vdata loaded on a data line DL to the first node N1 in response to a gate signal SCAN when the display panel PAN is driven, and enable the driving transistor DT to be turned on. In this example, the first switching thin film transistor ST1 may include a gate electrode connected to the gate line GL, to which a scan signal SCAN is applied, a drain electrode connected to the data line DL, to which a data voltage Vdata is applied, and a source electrode connected to the first node N1.

The second switching thin film transistor ST2 can enable a source voltage at the second node N2 to be stored in a sensing capacitor Cx of the voltage readout line SRL by switching a current between the second node N2 and the sensing voltage readout line SRL in response to a sensing signal SEN. The second switching thin film transistor ST2 can reset the source voltage of the driving thin film transistor DT to an initialization voltage Vpre by switching a current flowing between the second node N2 and the sensing voltage readout line SRL in response to the sensing signal SEN when the display panel PAN is driven. In this example, the gate electrode of the second switching thin film transistor ST2 may be connected to the same sensing line SL or another sensing line SL, the drain and source electrodes thereof may be connected to the second node N2 and the sensing voltage readout line SRL, respectively.

Although the organic light emitting display device 100 having a structure including three thin film transistors (T) and one storage capacitor (C) (which may be referred to as a 3T1C structure) as illustrated in FIG. 3 has been discussed as an example, the organic light emitting display device 100 of the present disclosure is not limited to the specific structure. For example, the organic light emitting display device 100 according to embodiments of the present disclosure may have one or more of various structures such as 4T1C, 5T1C, 6T1C, 7T1C, 8T1C, and the like.

FIG. 4A is a cross-sectional view of the organic light emitting display device 100 according to an embodiment of the present disclosure, and illustrates a first thin film transistor GT including a polycrystalline semiconductor pattern as a representative thin film transistor disposed in the non-display area NA, for example, a GIP area, and a driving thin film transistor DT including a first oxide semiconductor pattern, a first switching thin film transistor ST-1 including a second oxide semiconductor pattern, and a storage capacitor Cst, which are disposed inside of a subpixel in the display area AA and configured to drive an organic electroluminescent element such as an organic light emitting diode.

FIG. 4B illustrates an embodiment where only a storage capacitor is formed or disposed differently from the storage capacitor Cst in the embodiment of FIG. 4A, and configurations and/or forming of the remaining elements are substantially the same as those in the embodiment of FIG. 4A.

As illustrated in FIG. 4A, the driving thin film transistor DT and the switching thin film transistor ST may be disposed in the subpixel over a substrate 401. Although FIG. 4A illustrates the driving thin film transistor DT and one switching thin film transistor ST, this is merely for convenience of description, and in an actual implementation, a plurality of switching thin film transistors may be disposed in the subpixel.

In an embodiment, one or more first thin film transistors GT included in the gate driver may be disposed in the non-display area NA of the substrate 401.

The first thin film transistor GT may include a polycrystalline semiconductor pattern 414 disposed on at least one lower buffer layer (402 and/or 411) disposed on the substrate 401, a first gate insulating layer 442 for insulating the polycrystalline semiconductor pattern 414, a first gate electrode 416 disposed on the first gate insulating layer 442 and overlapping the polycrystalline semiconductor pattern 414, a plurality of insulating layers disposed on the first gate electrode 416, and a first source electrode 417S and a first drain electrode 417D disposed on the plurality of insulating layers.

The first thin film transistor GT may further include a first light shield pattern BSM-1, which is located under the polycrystalline semiconductor pattern 414, for protecting the polycrystalline semiconductor pattern 414 from light coming from the outside. In an embodiment, the first light shield pattern BSM-1 may not be needed. Thus, the first light shield pattern BSM-1 may be selectively formed according to design considerations.

The first light shield pattern BSM-1 may be a metal pattern formed on a first lower buffer layer 402. The material of the first light shield pattern BSM-1 according to embodiments of the present disclosure are not limited to such a thin film metal.

The first light shield pattern BSM-1 may be formed under the polycrystalline semiconductor pattern 414 and have a larger size than the polycrystalline semiconductor pattern 414 in order to completely shield external light from entering the polycrystalline semiconductor pattern 414. For example, the first light shield pattern BSM-1 may completely overlap the polycrystalline semiconductor pattern 414.

The substrate 401 may have a multilayer structure in which an organic layer and an inorganic layer are alternately stacked. For example, the substrate 401 may be formed such that an organic layer such as polyimide and an inorganic layer such as silicon oxide (SiO2) are alternately stacked.

The first lower buffer layer 402 may be disposed on the substrate 401. The first lower buffer layer 402 can block or at least reduce moisture and the like that may penetrate from the outside, and may be formed such that at least one silicon oxide (SiO2) film and/or the like are stacked to form a multilayer.

The first light shield pattern BSM-1 may be disposed on the first lower buffer layer 402.

A second lower buffer layer 411 may be further disposed on the first light shield pattern BSM-1. The second lower buffer layer 411 may include the same material as the first lower buffer layer 402.

The polycrystalline semiconductor pattern 414 may be disposed on the second lower buffer layer 411. The polycrystalline semiconductor pattern 414 may be formed with a polycrystalline semiconductor material, and include a first channel region 414a through which charges move, and a first source region 414b and a first drain region 414c adjacent to the first channel region 414a interposed between the first source region 414b and the first drain region 414c. The first source region 414b and the first drain region 414c may be conductive regions resulting from doping impurity ions such as phosphorus or boron in an intrinsic polycrystalline semiconductor pattern.

The polycrystalline semiconductor pattern 414 can be insulated by the first gate insulating layer 442.

The first gate insulating layer 442 may be formed from the deposition of an inorganic insulating layer such as silicon oxide (SiO2) on the entire surface of the substrate 401 on which the polycrystalline semiconductor pattern 414 is formed. The first gate insulating layer 442 can protect and insulate the polycrystalline semiconductor pattern 414 from the outside.

The first gate electrode 416 overlapping the first channel region 414a of the polycrystalline semiconductor pattern 414 may be disposed on the first gate insulating layer 442.

The first gate electrode 416 may include a metal material. For example, the first gate electrode 416 may be formed from a single layer or a multilayer including one or more, or one or more of alloys including two or more, of molybdenum (Mo), aluminum (Al), chromium (Cr), gold (Au), titanium (Ti), nickel (Ni), neodymium (Nd), and copper (Cu); however, embodiments of the present disclosure are not limited thereto.

A plurality of insulating layers may be disposed between the first gate electrode 416 and the first source and drain electrodes (417S and 417D).

Referring to FIG. 4A, the plurality of insulating layers may include a first interlayer insulating layer 443 contacting the upper surface of the first gate electrode 416, and a second interlayer insulating layer 444, an upper buffer layer 445, a second gate insulating layer 446, and a third interlayer insulating layer 447, which are sequentially stacked on the first interlayer insulating layer 443. The first interlayer insulating layer 443 and the second interlayer insulating layer 444 may be referred to as an intermediate insulating layer to distinguish them from the third interlayer insulating layer 447.

The first source electrode 417S and the first drain electrode 417D may be disposed on the third interlayer insulating layer 447. The first source electrode 417S and the first drain electrode 417D may be respectively directly connected to the first source region 414b and the first drain region 414c through a first contact hole CH1 and a second contact hole CH2 passing through the first gate insulating layer 442, the first interlayer insulating layer 443, the second interlayer insulating layer 444, the upper buffer layer 445, the second gate insulating layer 446, and the third interlayer insulating layer 447.

For example, the first source electrode 417S and the first drain electrode 417D may be respectively connected to the first source region 414b and the first drain region 414c through a first connection electrode CE1 disposed in the first contact hole CH1.

The first contact hole CH1 may include a first part CH1-1 passing through the first gate insulating layer 442, the first interlayer insulating layer 443, the second interlayer insulating layer 444, and the upper buffer layer 445, and a second part CH1-2 passing through the second gate insulating layer 446 and the third interlayer insulating layer 447.

For example, the first connection electrode CE1 disposed in the first contact hole CH1 may include a first part disposed in the first part CH1-1 of the first contact hole and a second part disposed in the second part CH1-2 of the first contact hole.

The first part of the first connection electrode CE1 and the second part of the first connection electrode CE1 may have at least one connection node connected to each other inside of the first contact hole CH1.

Referring to FIG. 4A, the first part of the first connection electrode CE1 and the second part of the first connection electrode CE1 may have the connection node at a boundary between the upper buffer layer 445 and the second gate insulating layer 446.

The connection node may be formed in a portion where the first part and the second part are connected as the first part and the second part are formed through different processes.

The first part of the first connection electrode CE1 and the second part of the first connection electrode CE1 may include the same conductive material as the first source electrode 417S and the first drain electrode 417D.

For example, the second part of the first connection electrode CE1 and the source and drain electrodes (417S and 417D) may be formed by one photolithography process substantially simultaneously or together.

In an embodiment, the first part of the first connection electrode CE1 and the second part of the first connection electrode CE1 may include different conductive materials. For example, the first part of the first connection electrode CE1 and the second part of the first connection electrode CE1 may ohmically contact (e.g., direct contact) each other to reduce resistance.

The first connection electrode CE1 may be formed from a single layer or multiple layers. The first connection electrode CE1 may be formed from multiple layers in which titanium, aluminum, and titanium are stacked.

For example, the first interlayer insulating layer 443 may include at least one inorganic layer, and may include a silicon nitride layer (SiNx) including hydrogen particles.

Hydrogen particles may diffuse into the first source region 414b and the first drain region 414c during a heat treatment process after the first interlayer insulating layer 443 is disposed to cover the first gate electrode 416, this allowing the first source region 414b and the first drain region 414c to become conductive. Accordingly, there is provided an advantage of reducing the associated process because a separate impurity doping process is not needed to make the first source region 414b and the first drain region 414c, which are intrinsic semiconductor materials, become conductive.

In an embodiment, the pixel circuit part 430 of the subpixel may include one driving thin film transistor DT and at least one switching thin film transistor ST. In the example where one or more switching thin film transistors ST are included in the subpixel, all of the one or more switching thin film transistors may include an oxide semiconductor pattern, or some of the switching thin film transistors may include an oxide semiconductor pattern and the others thereof may include a polycrystalline semiconductor pattern (which may be referred to as a hybrid type).

For example, FIG. 4A illustrates one driving thin film transistor DT including an oxide semiconductor pattern and one switching thin film transistor including an oxide semiconductor pattern.

The driving thin film transistor DT may include a first oxide semiconductor pattern 424, a second gate electrode 426 overlapping the first oxide semiconductor pattern 424, a second source electrode 427A, and a second drain electrode 427D.

The oxide semiconductor may include an oxide of a metal such as zinc (Zn), indium (In), gallium (Ga), tin (Sn), titanium (Ti), or the like, or a combination of a metal such as zinc (Zn), indium (In), gallium (Ga), tin (Sn), titanium (Ti), or the like and an oxide of zinc (Zn), indium (In), gallium (Ga), tin (Sn), titanium (Ti), or the like. More specifically, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), or the like In the conventional technology, a polycrystalline semiconductor pattern advantageous for high speed operation has been used as an active layer of a driving thin film transistor. However, the driving thin film transistor including the polycrystalline semiconductor pattern has suffered from a leakage current flowing in an off state and power consumption caused by the leakage current. In particular, such power consumption caused in the off state becomes more problematic when the display device operates at a low speed as in a situation of displaying a still image such as a textual document, a photograph, and the like. According to embodiments of the present disclose, the display device 100 may include driving thin film transistors including the oxide semiconductor pattern advantageous for preventing or reducing leakage current as an active layer.

In the example where a thin film transistor employs an oxide semiconductor pattern as an active layer, since a current fluctuation value for a unit voltage fluctuation value is large due to the material characteristics of the oxide semiconductor, there often occur display artifacts at low grayscales where accurate current control is required. To address this issue, according to embodiments of the present disclose, the display device 100 may include a driving thin film transistor including an oxide semiconductor pattern in which a current fluctuation value in an active layer is relatively less affected by a fluctuation value of a voltage applied to a gate electrode.

The driving thin film transistor DT may include the first oxide semiconductor pattern 424 located on the upper buffer layer 445, the second gate insulating layer 446 covering the first oxide semiconductor pattern 424, the second gate electrode 426 disposed on the second gate insulating layer 446 and overlapping the first oxide semiconductor pattern 424, the third interlayer insulating layer 447 covering the second gate electrode 426, and the second source electrode 427S and the second drain electrode 427D disposed on the third interlayer insulating layer 447.

The first oxide semiconductor pattern 424 serving as an active layer may include a second channel region 424a through which charges move, and a second source region 424b and a second drain region 424c adjacent to the second channel region 424a that is interposed between the second source region 424b and the second drain region 424c.

The second channel region 424a may include an intrinsic oxide semiconductor in which impurities are not doped. In an embodiment, the second source region 424b and the second drain region 424c may be conductive regions resulting from doping impurity ions of group 3 or group 5 in an intrinsic oxide semiconductor.

A second light shield pattern BSM-2 may be formed under the first oxide semiconductor pattern 424. The second light shield pattern BSM-2 may be a metal pattern capable of shielding external light in order to prevent the first oxide semiconductor pattern 424 from malfunctioning due to the external light reaching the first oxide semiconductor pattern 424.

The second light shield pattern BSM-2 may be a metal layer including a titanium (Ti) material having excellent ability to trap hydrogen particles. For example, the second light shield pattern BSM-2 may be formed from a single layer of titanium or a multilayer of molybdenum (Mo) and titanium (Ti), or include an alloy of molybdenum (Mo) and titanium (Ti). However, embodiments of the present disclosure are not limited thereto. For example, the second light shield pattern BSM-2 may also be formed from another metal layer including titanium (Ti).

Titanium (Ti) can trap hydrogen particles diffusing into the upper buffer layer 445 to prevent the hydrogen particles from reaching the first oxide semiconductor pattern 474.

In an embodiment, the second light shield pattern BSM-2 may be disposed vertically under the first oxide semiconductor pattern 424 so that the second light shield pattern BSM-2 can overlap the first oxide semiconductor pattern 424. In an embodiment, the second light shield pattern BSM-2 may have a greater size or area than the first oxide semiconductor pattern 424 so that the second light shield pattern BSM-2 can completely overlap the first oxide semiconductor pattern 424.

The second source electrode 427S of the driving thin film transistor DT may be electrically connected to the second light shield pattern BSM-2. In the example where the second light shield pattern BSM-2 is electrically connected to the second source electrode 427S, additional advantages can be obtained as described below.

As the second source region 424*b* and the second drain region 424*c* are doped with impurities, a parasitic capacitance $C_{act}$ may be formed inside the first oxide semiconductor pattern 424, a parasitic capacitance $C_{gi}$ may be formed between the second gate electrode 426 and the first oxide semiconductor pattern 474, and a parasitic capacitance $C_{buf}$ may be formed the second light shield pattern BSM-2 electrically connected to the second source electrode 427S and the first oxide semiconductor pattern 424.

Since the first oxide semiconductor pattern 424 and the second light shield pattern BSM-2 are electrically connected by the second source electrode 427S, therefore, the parasitic capacitance $C_{act}$ and the parasitic capacitance $C_{buf}$ may be connected in parallel with each other, and the parasitic capacitance $C_{act}$ and the parasitic capacitance $C_{gi}$ may be connected in series. When a gate voltage of $V_{gat}$ is applied to the second gate electrode 426, an effective voltage $V_{eff}$ actually applied to the first oxide semiconductor pattern 474 can be obtained by Equation 1 below.

$$\Delta V = Cgi/(Cgi + Cact + Cbuf) \times \Delta Vgat$$

Accordingly, since the effective voltage $V_{eff}$ applied to the second channel region 424*a* is in inverse proportion to the parasitic capacitance $C_{buf}$, the effective voltage applied to the first oxide semiconductor pattern 474 can be adjusted by adjusting the parasitic capacitance $C_{buf}$. For example, when the second light shield pattern BSM-2 is disposed close to the first oxide semiconductor pattern 424 to increase the parasitic capacitance $C_{buf}$, an actual current value flowing through the first oxide semiconductor pattern 424 can be reduced.

The reduction of the effective current value flowing through the first oxide semiconductor pattern 424 may mean that the s-factor of the driving thin film transistor DT can be increased, and that a control range of the driving thin film transistor DT that can be controlled through the voltage $V_{gat}$ actually applied to the second gate electrode 426 can be widened.

Thus, when the second source electrode 424S of the driving thin film transistor DT and the second light shield pattern BSM-2 are electrically connected, and the second light shield pattern BSM-2 is disposed close to the first oxide semiconductor pattern 424, an organic light emitting element such as an organic light emitting diode can be accurately controlled even at low grayscales, and thereby, display artifacts such as color differences, screen blotches, and the like occurring frequently at low grayscales can be solved.

Here, the s-factor is sometimes referred to as a "sub-threshold slope" and represents a voltage required when a current rises 10 times. In a graph showing the characteristics of drain current versus gate voltage (I-V curve), the s-factor equals to an inverse value of a slope of the graph in a range below a threshold voltage.

A situation where the s-factor is small may mean that the slope of the characteristic graph (I-V) of the drain current with respect to the gate voltage is large. In this situation, a corresponding thin film transistor can be turned on even by a small voltage, and thus, the switching characteristics of the thin film transistor can be improved. However, as the threshold voltage is reached over a short time, corresponding grayscales may not be sufficient to accurately display images.

A situation where the s-factor is large may mean that the slope of the characteristic graph (I-V) of the drain current with respect to the gate voltage is small. In this situation, while the on/off response speed of a corresponding thin film transistor can be reduced, corresponding grayscales may be sufficient to accurately display images as the threshold voltage is reached over a relatively long time.

For example, the second light shield pattern BMS-2 may be disposed close to the second oxide semiconductor pattern 424 as the second light shield pattern BMS-2 is inserted inside of the upper buffer layer 445. In an embodiment, FIG. 4A illustrates that a plurality of sub-upper buffer layers are used. For example, the upper buffer layer 445 may have a structure in which a first sub-upper buffer layer 445*a* and a second sub-upper buffer layer 445*b* are stacked. In an embodiment, the upper buffer layer 445 may have a structure in which the first sub-upper buffer layer 445*a*, the second sub-upper buffer layer 445*b*, and a third sub-upper buffer layer (not shown) are sequentially stacked.

The second light shield pattern BSM-2 may be disposed on the first sub-upper buffer layer 445*a* disposed on the second interlayer insulating layer 444. The second sub-upper buffer layer 445*b* may be disposed on the second light shield pattern BSM-2.

Although the embodiment of FIG. 4A illustrates the structure in which the plurality of sub-upper buffer layers are stacked so that the second light shield pattern BSM-2 can be inserted inside of the upper buffer layer 445, but embodiments of the present disclosure are not limited thereto. As suggested in Equation 1 described above, since an effective voltage applied to the second channel region 424*a* can be adjusted by adjusting a distance between the second light shield pattern BSM-2 and the first oxide semiconductor pattern 424, a technique for adjusting the distance between the second light shield pattern BSM-2 and the first oxide semiconductor pattern 424 can be provided.

The first sub-upper buffer layer 445*a* and the second sub-upper buffer layer 445*b* may include silicon oxide (SiO2).

The first sub-upper buffer layer 445a and the second sub-upper buffer layer 445b may include silicon oxide (SiO2) not containing hydrogen particles, and therefore, the oxide semiconductor pattern can be protected from hydrogen particles that may penetrate during a heat treatment process, and the reliability of the oxide semiconductor pattern can be improved.

The second light shield pattern BSM-2 may be a metal layer including a titanium (Ti) material having excellent ability to trap hydrogen particles. For example, the second light shield pattern BSM-2 may be formed from a single layer of titanium, a multilayer of molybdenum (Mo) and titanium (Ti), or an alloy of molybdenum (Mo) and titanium (Ti). However, embodiments of the present disclosure are not limited thereto. For example, the second light shield pattern BSM-2 may be also formed from another metal layer including titanium (Ti).

Titanium (Ti) can trap hydrogen particles diffusing into the upper buffer layer 445 to prevent the hydrogen particles from reaching the first oxide semiconductor pattern 424.

In an embodiment, the second light shield pattern BSM-2 may be, considering the function thereof, disposed vertically under the first oxide semiconductor pattern 424 so that the second light shield pattern BSM-2 can overlap the first oxide semiconductor pattern 424. In an embodiment, the second light shield pattern BSM-2 may have a greater size or area than the first oxide semiconductor pattern 424 so that the second light shield pattern BSM-2 can completely overlap the first oxide semiconductor pattern 424.

The second gate electrode 426 of the driving thin film transistor DT may be disposed over the first oxide semiconductor pattern 424. The second gate electrode 426 may overlap the second channel region 424a. The second gate insulating layer 446 may be interposed between the second gate electrode 426 and the first oxide semiconductor pattern 424.

The second source electrode 427S and the second drain electrode 427D may be disposed over the second gate electrode 426.

The third interlayer insulating layer 447 may be interposed between the second source and drain electrodes (427S and 427D) and the second gate electrode 426.

The second source electrode 427S may be connected to the second source region 424b through a fifth contact hole CH5 passing through the second gate insulating layer 446 and the third interlayer insulating layer 447, and the drain electrode 427D may be connected to the second drain region 424C through a sixth contact hole CH6 passing through the second gate insulating layer 446 and the third interlayer insulating layer 447.

In an embodiment, the second source electrode 427S may be electrically connected to the second light shield pattern BSM-2 through a fourth contact hole CH4 passing through a portion of the upper buffer layer 445, the second gate insulating layer 446, and the third interlayer insulating layer 447.

Each of the fifth contact hole CH5 and the sixth contact hole CH6 may be formed as a single body, and a second connection electrode CE2 may be disposed inside of each of the fifth contact hole CH5 and the sixth contact hole CH6.

The second source electrode 427S and the second drain electrode 427D may be respectively connected to the second source region 424b and the second drain region 224c by the respective second connection electrode CE2.

The second connection electrode CE2 and the second source and drain electrodes (427S and 427D) may include a same conductive material. For example, the second connection electrode CE2, the second source electrode 427S, and the second drain electrode 427D may include the same material as, and be substantially simultaneously formed with, the first source electrode 417S and the first drain electrode 417D.

In an embodiment, the second light shield pattern BSM-2 may be connected to the second source electrode 427S through a third connection electrode CE3 disposed inside of the fourth contact hole CH4.

The fourth contact hole CH4 may include a first part CH4-1 formed in the second sub-upper buffer layer 445b, and a second part CH4-2 formed by passing through the second gate insulating layer 446 and the third interlayer insulating layer 447.

The third connection electrode CE3 may include a first part formed in the first part CH4-1 of the fourth contact hole and a second part formed in the second part CH4-2 of the fourth contact hole, and have a connection node at a boundary between the first part and the second part.

The first part of the third connection electrode CE3 and the second part of the third connection electrode CE3 may include a same conductive material. In an embodiment, the first part of the third connection electrode CE3 and the second part of the third connection electrode CE3 may include different conductive materials, and in this embodiment, the first part and the second part may include different types of conductor materials, which can allow an ohmic contact with each other, in order to have a small contact resistance.

The second source and drain electrodes (427S and 427D) and the second part of the third connection electrode may include a same material and be substantially simultaneously formed.

Referring to FIG. 4A, the subpixel may further include a storage capacitor Cst.

The storage capacitor Cst may store a data voltage applied through a data line for a certain period of time, and provide the data voltage to an organic light emitting element such as an organic light emitting diode.

The storage capacitor Cst may include two electrodes corresponding to each other and a dielectric disposed therebetween. The storage capacitor Cst may include a first electrode 450A including the same material as the first gate electrode 416 and disposed in the same layer as the first gate electrode 416, and a second electrode 450B corresponding to the first electrode 450A.

The first interlayer insulating layer 443 may be interposed between the first electrode 450A and the second electrode 450B of the storage capacitor. The second electrode 450B of the storage capacitor may be electrically connected to the second source electrode 427S.

The second electrode 450B of the storage capacitor may be connected to the second source electrode 427S through a fourth connection electrode CE4 formed in a third contact hole CH3.

Similarly as in the first contact hole CH1 and the fourth contact hole CH4, the third contact hole CH3 may include two parts. Similarly as in the first connection electrode CE1 and the third connection electrode CE3, the fourth connection electrode CE4 may have a connection node between two edges thereof, for example, in a middle portion thereof.

For example, the third contact hole CH3 may include a first part CH3-1 passing through the upper buffer layer 445 and the second interlayer insulating layer 444, and a second part CH3-2 passing through the second gate insulating layer 446 and the third interlayer insulating layer 447. In an embodiment, the fourth connection electrode CE4 may include a first part formed in the first part CH3-1 of the third contact hole and a second part formed in the second portion CH3-2 of the third contact hole, and have a connection node at a boundary between the first part and the second part.

FIG. 4B illustrates that a storage capacitor Cst is configured differently from the storage capacitor Cst in the embodiment of FIG. 4A.

The second electrode 450B of the storage capacitor of FIG. 4A is disposed in a layer different from the second light shield pattern BSM-2. In this embodiment where the second electrode 450B of the storage capacitor and the second light shield pattern BSM-2 are formed in different layers, since an additional mask process is needed, therefore, in the embodiment of FIG. 4B, the second electrode 450B of the storage capacitor and the second light shield pattern BSM-2 may be formed together during one mask process. The remaining elements included in the embodiment of FIG. 4B may be substantially the same as that of FIG. 4A, and thus, related discussions will be omitted for convenience of description.

Referring to FIG. 4A, the subpixel may include a switching thin film transistor ST including the oxide semiconductor pattern. Although one switching thin film transistor is illustrated in FIG. 4A, one or more switching thin film transistors ST may be disposed in the subpixel. For example, one or more switching thin film transistors may be disposed in the pixel circuit of the subpixel according to various configurations such as 3T1C, 4T1C, 5T1C, 6T1C, 7T1C, 8T1C, and the like.

The switching thin film transistor ST may include a second oxide semiconductor pattern 432, a third gate electrode 433, a third source electrode 434S, and a third drain electrode 434D.

The second oxide semiconductor pattern 432 may include a third channel region 432a, and third source and drain regions (432b and 432c) adjacent to the third channel region 432a interposed between the third source and drain regions (432b and 432c).

The third gate electrode 433 may be located on the second gate insulating layer 446 located on the second oxide semiconductor pattern 432.

The third source electrode 434S and the third drain electrode 434D may be located on the third interlayer insulating layer 447 located on the third gate electrode 433.

The third source electrode 434S and the third drain electrode 434D may be respectively connected to the third source region 432b and the third drain region 432c through a seventh contact hole CH7 and an eighth contact hole CH8 passing through the second gate insulating layer 446 and the third interlayer insulating layer 447.

In an embodiment, a third light shield pattern BSM-3 may be disposed under the second oxide semiconductor pattern 432.

The third light shield pattern BSM-3 may be disposed under the second oxide semiconductor pattern 432 while overlapping the second oxide semiconductor pattern 432 in order to protect the second oxide semiconductor pattern 432 from light coming from the outside.

The third light shield pattern BSM-3 may be disposed on the first gate insulating layer 442 or the first interlayer insulating layer 443.

The third light shield pattern BSM-3 may include the same material, and be disposed in the same layer, as the first gate electrode 416. In an embodiment, the third light shield pattern BSM-3 may include the same material, and be disposed in the same layer, as the first electrode 450A or the second electrode 450B of the storage capacitor Cst.

Although not shown in FIG. 4A, the third light shield pattern BSM-3 may be electrically connected to the third source electrode 434S. The third light shield pattern BSM-3 can protect the second oxide semiconductor pattern 432 from external light, and in some embodiments, a voltage may be applied to the third light shield pattern BSM-3 so that the third channel region 432a can be stabilized, and thereby, the reliability of the switching thin film transistor ST can be improved.

In some embodiments, the display device 100 may include a bezel bending structure. Referring to FIG. 4C, when the first part CH1-1 of the first contact hole of the non-display area is formed, the upper buffer layer 445 formed in a bezel bending area BA of the non-display area NA and one or more inorganic insulating layers disposed between the upper buffer layer 445 and the substrate 401 may be also etched and removed. Referring to FIG. 4C, all inorganic insulating layers located within a height of d2 from the substrate 401 may be removed to form the second opened portion OA2. In this process, a portion of the upper surface of the substrate 401 located in the non-display area NA may also be etched.

The inorganic insulating layers may include the first lower buffer layer 402, the second lower buffer layer 411, the first gate insulating layer 442, the first interlayer insulating layer 443, the second interlayer insulating layer 444, and the upper buffer layer 445.

The first part CH1-1 of the first contact hole may pass through the first interlayer insulating layer 443 including hydrogen particles formed on the first gate electrode 416, and in this situation, the hydrogen particles may be generated. Such hydrogen particles may contribute to conducting the source region and the drain region of the polycrystalline semiconductor pattern during the heat treatment process, but when these hydrogen particles enter the oxide semiconductor pattern, the reliability of the thin film transistor may be lowered. In some embodiments, before oxide semiconductor patterns are disposed on the upper buffer layer 445, the first part CH1-1 of the first contact hole may be formed in advance, and thereby, the oxide semiconductor patterns can be protected from hydrogen particles that may be generated from the first interlayer insulating layer 443.

In an embodiment, the bezel bending area BA may include the first opened portion OA1. The first opened portion OA1 may be substantially simultaneously formed when the fifth contact hole CH5 to the eighth contact hole CH8 of the display area AA are formed. For example, the first opened portion OA1 may be formed by etching the second gate insulating layer 446 and the third interlayer insulating layer 447 disposed in the non-display area NA.

Since the bezel bending area BA is an area in which the base substrate 401 and the thin films or layers stacked thereon are folded or bent, all inorganic insulating layers allowing cracks to easily develop may be therefore desired to be removed.

In an embodiment, all inorganic insulating layers disposed on the substrate 401 in the bezel bending area BA may be removed, and instead, a first planarization layer PLN1 and a second planarization layer PLN2 which may be organic layers may be disposed. Thereby, lines or other elements disposed in the bezel bending area BA can be protected.

Referring to FIG. 4A, after the pixel circuit part 430 including the plurality of thin film transistors in the display area AA is disposed, a light emitting element part 460 and an encapsulation layer 470 may be further disposed over the substrate 401.

The first planarization layer PLN1 may be disposed over the substrate 401 over which the driving thin film transistor DT and the switching thin film transistor ST are disposed. The first planarization layer PLN1 may include an organic material such as photoacrylic, or may be formed from a plurality of layers including an inorganic layer and an organic layer. A connection electrode 455 may be disposed on the first planarization layer PLN1. The connection electrode 455 can electrically connect an anode electrode 456 of the light emitting element part 460 to the driving thin film transistor DT through a ninth contact hole CH9 formed in the first planarization layer PLN1.

In an embodiment, a conductive layer used when the connection electrode 455 is formed may form a portion of a link line 452 in the bending area BA.

The second planarization layer PLN2 may be disposed on the connection electrode 455. As in the first planarization layer PLN1, the second planarization layer PLN2 may include an organic material such as photoacrylic, or may be formed from a plurality of layers including an inorganic layer and an organic layer.

The anode electrode 456 may be disposed on the second planarization layer PLN2. The anode electrode 456 may be electrically connected to the connection electrode 455 through the ninth contact hole CH9 formed in the second planarization layer PLN2.

The anode electrode 456 may be formed from a single layer or a multilayer including one or more, or one or more of alloys including two or more, of metals such as Ca, Ba, Mg, Al, Ag, or the like, and may be connected to the second drain electrode 427D of the driving thin film transistor DT, so that an image signal can be applied to the anode electrode 456.

In addition to the anode electrode 456, an anode connection electrode 457 for electrically connecting a common voltage line VSS to a cathode electrode 463 may be further disposed in the non-display area NA.

A bank layer 461 may be disposed on the second planarization layer PLN2. The bank layer 461 may be a type of partition for partitioning each subpixel, and can protect the subpixel by preventing light of a specific color output from an adjacent subpixel from being mixed to light emitted from the subpixel.

An organic emission layer 462 may be disposed on the surface of the anode electrode 456 and on at least a portion of an inclined surface of the bank layer 461. The organic emission layer 462 may be disposed in each subpixel, and may be a R organic emission layer emitting red light, a G organic emission layer emitting green light, or a B organic emission layer emitting blue light. In an embodiment, the organic emission layer 462 may be a W organic light emitting layer emitting white light.

The organic emission layer 462 may include not only the emission layer, but also an electron injection layer and a hole injection layer for respectively injecting electrons and holes into the emission layer, and an electron transport layer and a hole transport layer for respectively transporting the injected electrons and holes to an organic layer.

The cathode electrode 463 may be disposed on the organic emission layer 462. The cathode electrode 463 may be include a transparent conductive material such as indium tin oxide (ITO) or indium zinc oxide (IZO), or a thin metal through which visible light is transmitted, but embodiments of the present disclosure are not limited thereto.

The encapsulation layer 470 may be disposed on the cathode electrode 463. The encapsulation layer 470 may be formed from a single layer including an inorganic layer, may be formed from two layers of an inorganic layer and an organic layer, or may be formed from three layers of an inorganic layer, an organic layer, and an inorganic layer. The inorganic layer may include an inorganic material such as SiNx, SiX, and the like, but embodiments of the present disclosure are not limited thereto. In some embodiments, the organic layer may include an organic material such as polyethylene terephthalate, polyethylene naphthalate, polycarbonate, polyimide, polyethylene sulfonate, polyoxymethylene, polyarylate, or the like, or a mixture thereof, but embodiments of the present disclosure are not limited thereto.

FIG. 4A illustrates, for example, the encapsulation layer portion 470 formed from three layers of an inorganic layer 471, an organic layer 472, and an inorganic layer 473.

A cover glass (not shown) may be disposed on the encapsulation layer 470, and for example, be attached using an adhesive layer (not shown). As the adhesive layer, although any material may be used as long as it has good adhesion and good heat resistance and water resistance, in some embodiments, a thermosetting resin such as an epoxy-based compound, an acrylate-based compound, or an acrylic rubber may be used. In an embodiment, a photocurable resin may be used as the adhesive layer, and the adhesive layer may be cured by irradiating the adhesive layer with light such as ultraviolet rays.

The adhesive layer can serve as an encapsulant for preventing the penetrating of moisture into the organic light emitting display device, as well as bonding the substrate 401 and the cover glass (not shown).

For example, a protective film such as a polystyrene (PS) film, a polyethylene (PE) film, a polyethylene naphthalate (PEN) film, a polyimide (PI) film, or the like, or glass may be used as the cover glass (not shown) serving as an encapsulation cap for encapsulating the organic light emitting display device 100.

As described, the connection electrodes (i.e., the first connecting electrode CE1, the third connecting electrode CE3, and the fourth connecting electrode CE4) may include the connection nodes, which are located between two edges of each connection electrode, according to a design consideration for the manufacturing process, and in turn, this can provide effects of preventing the reliability of the oxide semiconductor patterns 424 and 432 from being lowered due to hydrogen particles generating during the heat treatment process.

In the conventional technology, in order to reduce a mask process, the first source electrode 417S to the third source electrode 434S and the first drain electrode 417D to the third drain electrode 434D are simultaneously formed by one mask process. Further, each source electrode and a respective source region of each corresponding semiconductor pattern may be connected to each other through a contact hole formed by one mask process, and hydrogen particles may generate in the process of forming the contact hole.

That is, in the process of forming the contact hole, hydrogen particles included in the first interlayer insulating layer 443 and the second interlayer insulating layer 444 may penetrate into the oxide semiconductor pattern formed on the upper buffer layer 445, and thereby, the reliability of the oxide semiconductor pattern may be lowered. According to embodiments of the present disclosure, before oxide semiconductor patterns are disposed on the upper buffer layer 445, the first part CH1-1 of the first contact hole exposing the first source region 414b and the first drain region 414c of the polycrystalline semiconductor pattern is formed first, then the oxide semiconductor patterns is formed, and thereafter, the second part CH1-2 of the first contact hole is formed. Therefore, the reliability of the oxide semiconductor pattern can be prevented or at least reduced from being lowered due to hydrogen particles generating during the heat treatment process.

Hereinafter, a method of manufacturing the display device according to aspects of the present disclosure will be briefly described with reference to FIGS. 5A to 5E.

Figure 5A:
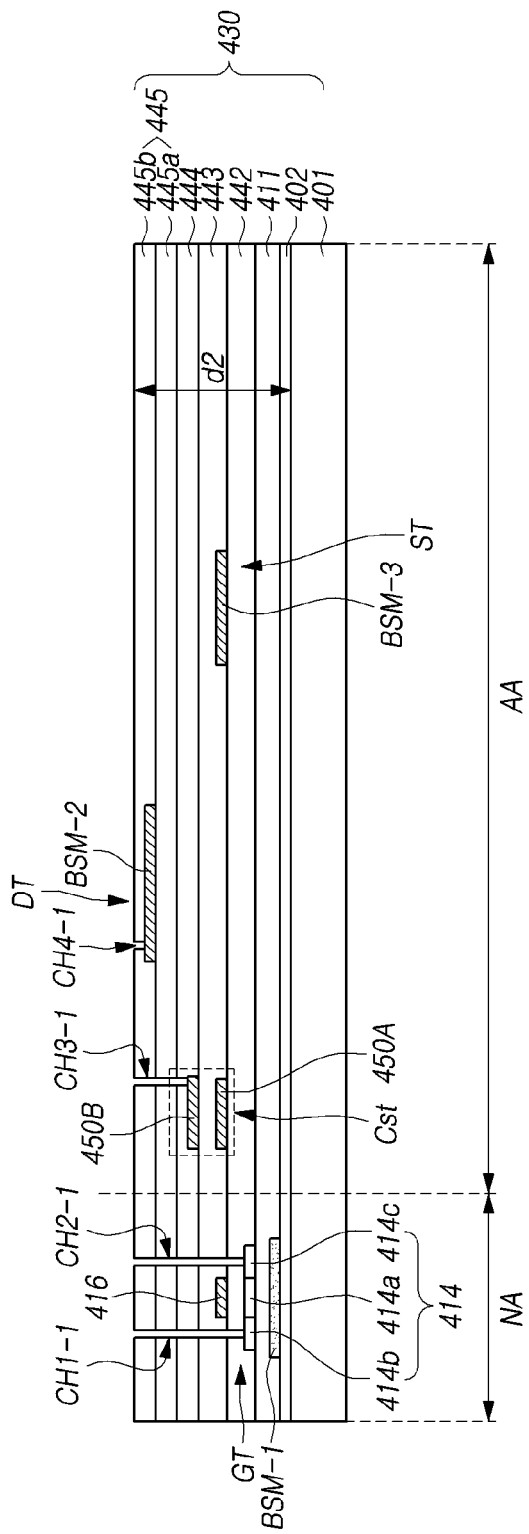
FIGS. 5A, 5B, 5C, 5D, and 5E are example cross-sectional views sequentially illustrating the process of manufacturing the organic light emitting display device in the embodiment of FIG. 4A according to one embodiment of the present disclosure.

Referring to FIG. 5A, a first lower buffer layer 402 including silicon oxide may be formed on a flexible substrate 401. The first lower buffer layer 402 may be formed from a plurality of layers. The first lower buffer layer 402 may be deposited on the entire upper surface of the substrate 401 including a display area AA and a non-display area NA. The first lower buffer layer 402 may be formed by chemical vapor deposition (CVD).

The first lower buffer layer 402 can serve to protect a thin film transistor array layer from oxygen particles, moisture, and the like penetrating from under the flexible substrate 401.

A first light shield pattern BSM-1 may be formed on the first lower buffer layer 402. The first light shield pattern BSM-1 can prevent semiconductor patterns formed on the substrate 401 from being affected by external light, and thereby, prevent the thin film transistors from malfunctioning.

Referring to FIG. 5A, the first light shield pattern BSM-1 may be formed under a first thin film transistor GT disposed in the non-display area NA. In the embodiment where a thin film transistor including a polycrystalline semiconductor pattern is formed in the display area NA, the first light shield pattern BSM-1 may be formed in this structure as well.

The first light shield pattern BSM-1 may be a conductive and opaque metal pattern. However, embodiments of the present disclosure are not limited thereto. For example, a semiconductor pattern or the like may be used for the first light shield pattern BSM-1.

The first light shield pattern BSM-1 may be formed by depositing a thin metal film on the first lower buffer layer 402 and then patterning it by performing a photolithography process.

A second lower buffer layer 411 may be deposited on the first light shield pattern BSM-1. The second lower buffer layer 411 may be formed in the same process, and using the same material, as the first lower buffer layer 402.

Then, a polycrystalline semiconductor pattern 414 may be formed on the second lower buffer layer 411. The polycrystalline semiconductor pattern 414 may be completed by depositing an amorphous semiconductor pattern on the second lower buffer layer 411, then crystallizing it using a crystallization method, and thereby, patterning it.

A first gate insulating layer 442 may be deposited on the polycrystalline semiconductor pattern 414. The first gate insulating layer 442 may be an inorganic layer including silicon oxide. The first gate insulating layer 442 can serve to electrically insulate between a first gate electrode 416 formed on the first gate insulating layer 442 and the polycrystalline semiconductor pattern 414.

The first gate electrode 416 may be formed on the first gate insulating layer 442. When the first gate electrode 416 is formed on the first gate insulating layer 442, a first electrode 450A of a storage capacitor and a third light shield pattern BSM-3 may be formed together. In addition, various link lines and pads disposed in the non-display area NA may be formed using the same metal material as the first gate electrode 416.

The first gate electrode 416 may include a metal material. For example, the first gate electrode 416 may be formed from a single layer or a multilayer including one or more, or one or more of alloys including two or more, of molybdenum (Mo), aluminum (Al), chromium (Cr), gold (Au), titanium (Ti), nickel (Ni), neodymium (Nd), and copper (Cu); however, embodiments of the present disclosure are not limited thereto.

The first gate electrode 416 may be formed by depositing a metal material on the first gate insulating layer 442 and then patterning it by performing a photolithography process.

The first gate electrode 416 may be formed such that the first gate electrode 416 partially overlaps the polycrystalline semiconductor pattern 414. The overlapping area may become a channel region of the polycrystalline semiconductor pattern 414.

A first interlayer insulating layer 443 may be formed on the first gate electrode 416. The first interlayer insulating layer 443 may be formed from a single layer or a multilayer formed such that an inorganic layer including silicon nitride is deposited to form the single layer or the multilayer. The first interlayer insulating layer 443 may include a silicon nitride layer including hydrogen particles. After the first interlayer insulating layer 443 is formed, hydrogen particles may diffuse and penetrate into the polycrystalline semiconductor pattern 414 in the process of performing heat treatment for the first interlayer insulating layer 443, and thereby the polycrystalline semiconductor pattern 414 may become conductive, resulting in a first source region 414b and a first drain region 414c being formed.

Next, a second electrode 450B of the storage capacitor overlapping the first electrode 450A of the storage capacitor may be formed on the first interlayer insulating layer 443.

The second electrode 450B of the storage capacitor may be formed using the same material as the first electrode 450A of the storage capacitor.

Next, a second interlayer insulating layer 444 including silicon oxide may be deposited on the second electrode 450B of the storage capacitor. Each or all of the first interlayer insulating layer 443 and the second interlayer insulating layer 444 may be formed from a single layer or a multilayer.

Next, an upper buffer layer 445 may be formed on the second interlayer insulating layer 444.

According to embodiments of the present disclosure, since the upper buffer layer 445 includes a second light shield pattern BSM-2, the upper buffer layer 445 may include a first sub-upper buffer layer 445-a and a second sub-upper buffer layer 445-b. The upper buffer layer 445 may include silicon oxide.

After the first sub-upper buffer layer 445-a is deposited on the second interlayer insulating layer 444, a second light shield pattern BSM-2 may be formed on the first sub-upper buffer layer 445-a.

Although FIG. 5A illustrates the embodiment in which the upper buffer layer 445 has a stacked structure of two inorganic layers, but embodiments of the present disclosure are not limited thereto. For example, the upper buffer layer 445 may have a stacked structure of a plurality of inorganic layers. A distance between the second light shield pattern BSM-2 and an oxide semiconductor pattern 424 can be adjusted by forming the second light shield pattern BSM-2 in one of the plurality of inorganic layers.

Next, the second sub-upper buffer layer 445-b may be deposited on the second light shield pattern BSM-2 to complete the upper buffer layer 445. The upper buffer layer 445 can serve to distinguish the polycrystalline semiconductor thin film transistor formed thereunder and the oxide semiconductor thin film transistor formed thereon.

According to embodiments of the present disclosure, after the upper buffer layer 445 is formed, a process of forming a contact hole passing through the deposited insulating layers may be performed first instead of consecutively forming the oxide semiconductor pattern 424 on the upper buffer layer 445.

In the contact hole process, a first part CH1-1 of a first contact hole exposing the first source region 414b, and a first part CH2-1 of a second contact hole exposing the first drain region 414c, a first part CH3-1 of a third contact hole exposing the second electrode 450B of the storage capacitor, and a first part CH4-1 of a fourth contact hole exposing the second light shield pattern BSM-2 may be substantially simultaneously formed.

Figure 5B:
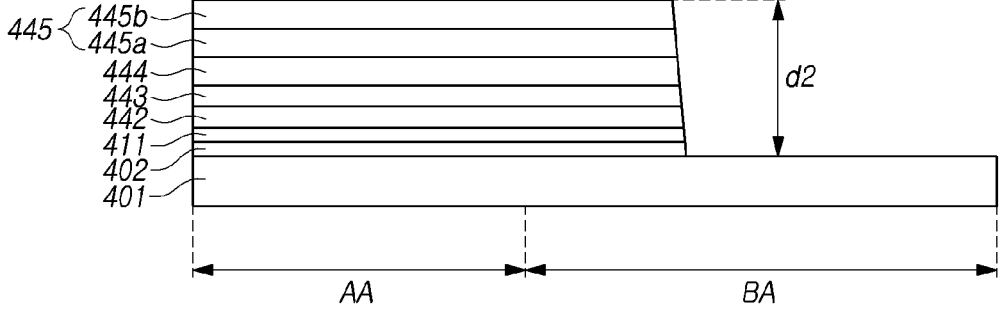

In addition, referring to FIG. 5B, at least a portion of each of inorganic layers deposited on the non-display area NA of the substrate 401 may be removed together. That is, referring to FIG. 5B, the inorganic layers disposed within a range (e.g., a depth of d2) from the upper surface of the upper buffer layer 445 to the surface of the substrate 401 may be removed as the inorganic layers in the non-display area NA are removed, the array substrate can be bent or folded.

As the first part CH1-1 of the first contact hole is formed by passing through the first interlayer insulating layer 443 including hydrogen particles, in this situation, the hydrogen particles may be generated. However, according to embodiments of the present disclosure, this process is performed before the oxide semiconductor pattern 424 is formed on the upper buffer layer 445, the damage of the oxide semiconductor pattern 424 from the hydrogen particles can be prevented or at least reduced.

Figure 5C:
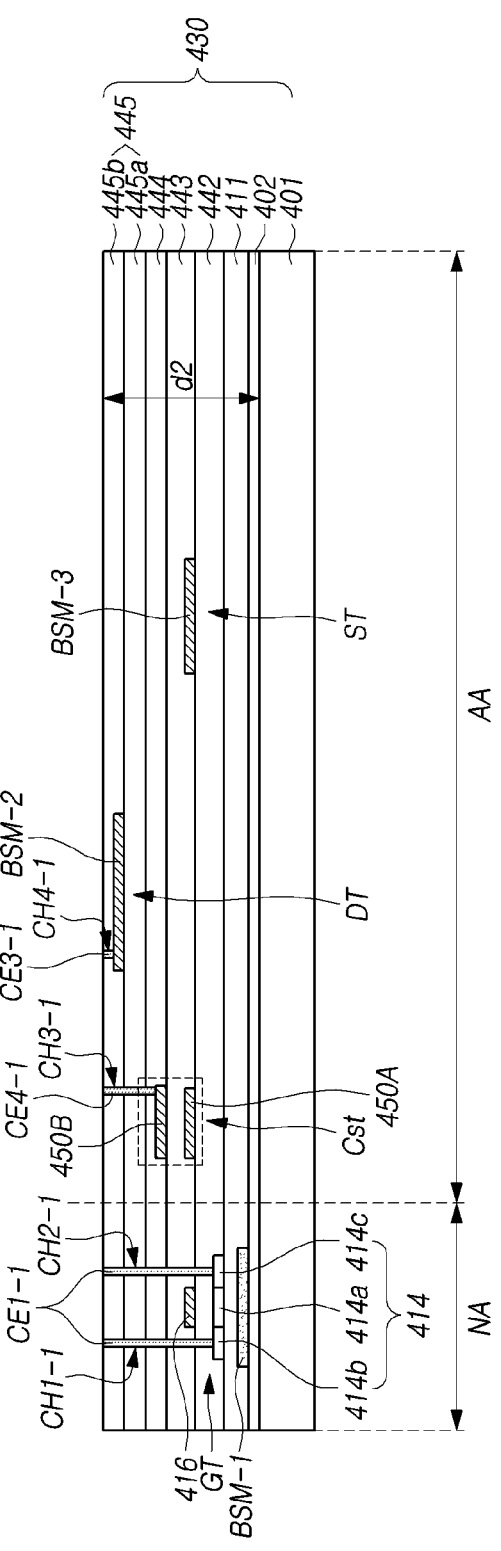

Next, referring to FIG. 5C, a first part CE1-1 of a first connection electrode may be formed in the first part CH1-1 of the first contact hole. The first part CE1-1 of the first connection electrode may be connected to the first source region 414b.

When the first part CE1-1 of the first connection electrode is formed, a first part CE3-1 of a third connection electrode and a first part CE4-1 of a fourth connection electrode may be formed together.

Figure 5D:
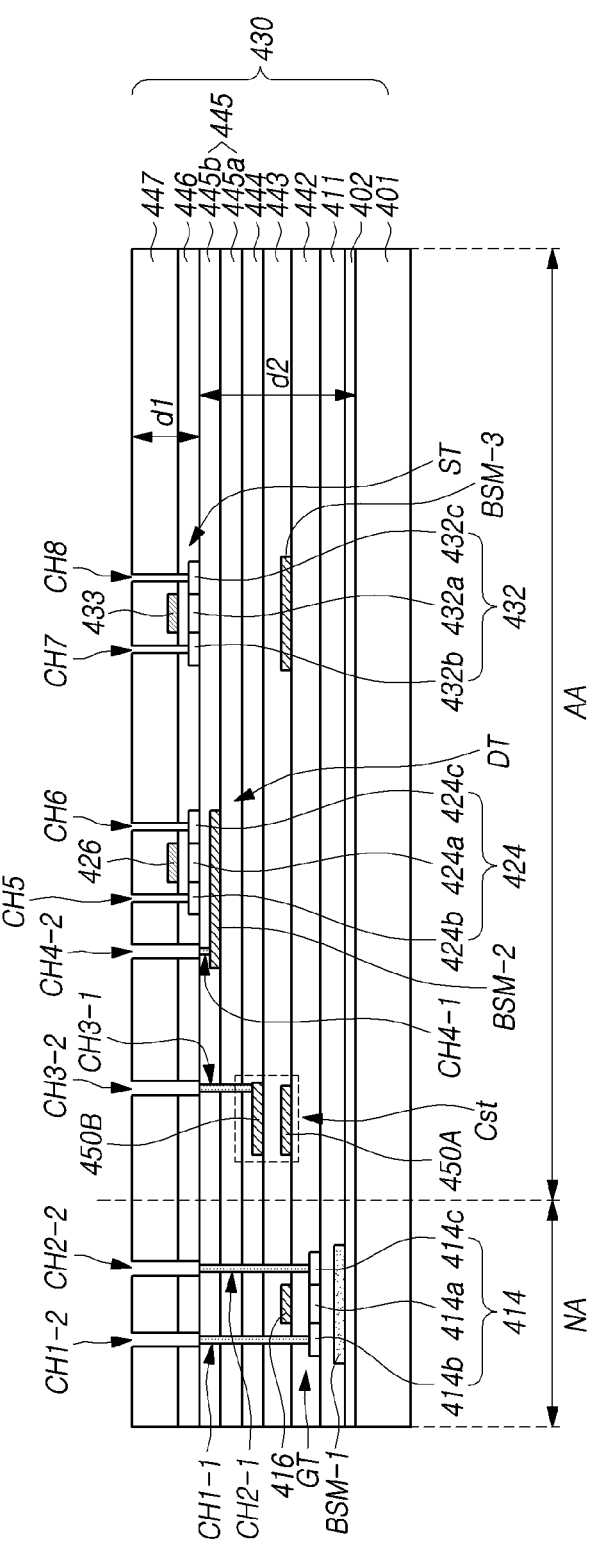

Next, referring to FIG. 5D, a first oxide semiconductor pattern 424 and a second oxide semiconductor pattern 432 may be formed on the upper buffer layer 445. Next, a second gate insulating layer 446, a second gate electrode 426, and a third interlayer insulating layer 447 may be sequentially formed on the first oxide semiconductor pattern 424 and the second oxide semiconductor pattern 432.

Next, a second part CH1-2 of the first contact hole passing through the third interlayer insulating layer 447 and the second gate insulating layer 446 may be formed.

When the second part CH1-2 of the first contact hole is formed, a second part CH3-2 of the third contact hole, a second part CH4-2 of the fourth contact hole, a fifth contact hole CH5 exposing a second source region 424b, a sixth contact hole CH6 exposing a second drain region 424c, a seventh contact hole CH7 exposing a third source region 432b, and an eighth contact hole CH8 exposing a third drain region 432c may be substantially simultaneously formed. For example, when the second part CH1-2 of the first contact hole is formed, the second gate insulating layer 446 and the third interlayer insulating layer 447 within a depth of d1 may be removed as illustrated in FIG. 5D.

In addition, the second gate insulating layer 446 and the third interlayer insulating layer 447 disposed in the non-display area NA of the substrate 401 may be removed together.

Figure 5E:
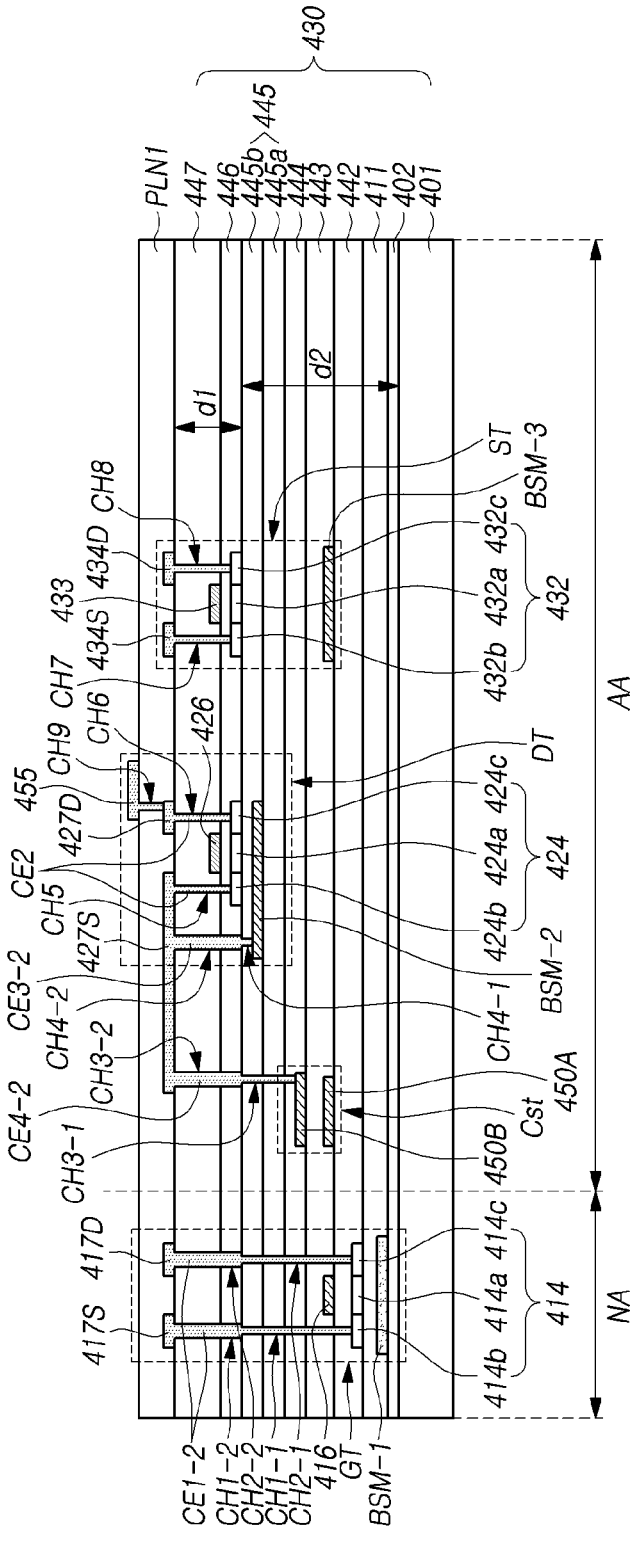

Next, referring to FIG. 5E, when the second part CE1-2 of the first contact hole is formed, a second connection electrode CE2, a second part CE3-2 of the third connection electrode, and a second part CE4-2 of the fourth connection electrode may be formed together.

The second part CE1-2 of the first contact hole may be formed together with a first source electrode 417S. Thus, the first source electrode 417S and the second part CE1-2 of the first connection electrode may be formed together through a single mask process. Since a second source electrode 427S and a second drain electrode 427D may be formed together with the first source electrode 417S and a first drain electrode 417D, the second connection electrode CE2 may be formed together with the second source electrode 427S and the second drain electrode 427D.

Next, a first planarization layer PLN1 covering the source and drain electrodes (417S, 417D, 427S, 427D, 434S, and 434D) may be formed, and then a second planarization layer PLN2 may be formed on the first planarization layer PLN1, leading the pixel circuit part 430 to be insulated.

The display device can be completed by forming a light emitting element part 460 and an encapsulation layer 470 on the second planarization layer PLN2.

The discussions given above and accompanying drawings are merely exemplary in nature and are not intended to limit the disclosure or its application. It should be noted that various modifications and variations such as combination, separation, substitution, and changes of configurations in the described examples and embodiments will be readily apparent to those skilled in the art, without departing from the scope of the embodiments and examples of present disclosure. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The scope of protection of the present disclosure is to be construed according to the claims, and all technical ideas within the scope of the claims should be interpreted as being included in the scope of the present invention.

What is claimed is:

1. An organic light emitting display device comprising:
   a substrate including a display area and a non-display area located outside of the display area;
   a first thin film transistor over the substrate, the first thin film transistor comprising a first semiconductor pattern, a first gate electrode overlapping the first semiconductor pattern, a first source electrode and a first drain electrode connected to the first semiconductor pattern through a plurality of interposed insulating layers, and a first light shield pattern located under the first semiconductor pattern;
   a second thin film transistor over the substrate, the second thin film transistor comprising a second semiconductor pattern in a layer different from the first semiconductor pattern, a second gate electrode overlapping the second semiconductor pattern, a second source electrode and a second drain electrode connected to the second semiconductor pattern, and a second light shield pattern located under the second semiconductor pattern, overlapping the second semiconductor pattern, and connected to one of the second source electrode and the second drain electrode;

a third thin film transistor over the substrate, the third thin film transistor comprising a third semiconductor pattern in a same layer as the second semiconductor pattern, a third gate electrode overlapping the third semiconductor pattern, a third source electrode and a third drain electrode connected to the third semiconductor pattern, and a third light shield pattern located under the third semiconductor pattern and overlapping the third semiconductor pattern, wherein a vertical distance between the second light shield pattern and the second semiconductor pattern is less than a vertical distance between the third light shield pattern and the third semiconductor pattern respective to a surface of the substrate, and the first source electrode and the first drain electrode pass through the plurality of interposed insulating layers and are connected by a first connection electrode comprising at least one connection node.

2. The organic light emitting display device according to claim 1, wherein the first semiconductor pattern comprises a polycrystalline semiconductor pattern, and the second semiconductor pattern and the third semiconductor pattern each comprise an oxide semiconductor pattern.

3. The organic light emitting display device according to claim 2, wherein the first thin film transistor is in one of the display area or the non-display area, and the second thin film transistor and the third thin film transistor are in the display area.

4. The organic light emitting display device according to claim 3, wherein the second thin film transistor is a driving thin film transistor in a subpixel, and the third thin film transistor is a switching thin film transistor in the subpixel.

5. The organic light emitting display device according to claim 1, wherein the plurality of interposed insulating layers comprises:

a first gate insulating layer between the first semiconductor pattern and the first gate electrode;

at least one intermediate insulating layer between the first gate electrode and an upper buffer layer, the upper buffer layer between the at least one intermediate insulating layer and the second semiconductor pattern;

a second gate insulating layer between the second semiconductor pattern and the second gate electrode; and an interlayer insulating layer between the second gate electrode and the second source electrode and the second drain electrode.

6. The organic light emitting display device according to claim 5, wherein the second light shield pattern is inside of the upper buffer layer, and the third light shield pattern is under the upper buffer layer.

7. The organic light emitting display device according to claim 6, wherein the upper buffer layer comprises a plurality of sub-buffer layers, and the second light shield pattern is between the plurality of sub-buffer layers.

8. The organic light emitting display device according to claim 6, wherein a first connection line comprises a connection node located between the upper buffer layer and the second gate insulating layer.

9. The organic light emitting display device according to claim 8, wherein the first connection line comprises a same material as the first source electrode and the second drain electrode.

10. The organic light emitting display device according to claim 8, wherein different conductors respectively ohmically contact upper and lower portions of the first connection line based on the connection node.

11. The organic light emitting display device according to claim 1, wherein the second source electrode and the second drain electrode are connected to the second semiconductor pattern through a second connection electrode formed as a single body.

12. The organic light emitting display device according to claim 1, further comprising:

at least one lower buffer layer on the substrate, wherein the first light shield pattern is disposed between the substrate and the first semiconductor pattern.

13. The organic light emitting display device according to claim 5, wherein the at least one intermediate insulating layer comprises a silicon nitride layer.

14. A method of manufacturing an organic light emitting display device, the method comprising:

preparing a substrate including a display area and a non-display area;

forming a first semiconductor pattern on at least one lower buffer layer located on the substrate;

forming a first light shield pattern that is located under the first semiconductor pattern and over the substrate;

forming a first gate insulating layer on the first semiconductor pattern;

forming a first gate electrode on the first gate insulating layer;

forming at least one intermediate insulating layer on the first gate electrode;

forming an upper buffer layer comprising a second light shield pattern on the at least one intermediate insulating layer;

forming a first part of a first contact hole that passes through the upper buffer layer, the at least one intermediate insulating layer, and the first gate insulating layer, the first part of the first contact hole exposing a portion of the first semiconductor pattern;

forming a first part of a first connection electrode connected to the first semiconductor pattern through the first part of the first contact hole;

forming a second semiconductor pattern on the upper buffer layer;

forming a second gate electrode on a second gate insulating layer located on the second semiconductor pattern, the second gate electrode overlapping the second semiconductor pattern;

forming an interlayer insulating layer on the second gate electrode;

forming a second part of the first contact hole that passes through the interlayer insulating layer and the second gate insulating layer, the second part of the first contact hole exposing the first part of the first connection electrode; and forming a second part of the first connection electrode connected to the first part of the first connection electrode through a second part of a second contact hole.

15. The method according to claim 14, wherein the at least one lower buffer layer comprises a first lower buffer layer between the substrate and the first light shield pattern and a second lower buffer layer between the first light shield pattern and the first semiconductor pattern.

16. The method according to claim 14, wherein forming the second semiconductor pattern on the upper buffer layer comprises forming a third semiconductor pattern comprising a same material as the second semiconductor pattern on the upper buffer layer.

17. The method according to claim 16, wherein forming the first gate electrode on the first gate insulating layer comprises forming a third light shield pattern that overlaps the third semiconductor pattern and a first electrode of a storage capacitor.

18. The method according to claim 17, further comprising:

forming a second electrode of the storage capacitor overlapping the first electrode of the storage capacitor between the first gate electrode and the upper buffer layer.

19. The method according to claim 18, wherein forming the upper buffer layer including the second light shield pattern on the at least one intermediate insulating layer comprises forming the second electrode of the storage capacitor that overlaps the first electrode of the storage capacitor.

20. The method according to claim 14, wherein forming the first part of the first contact hole that passes through the upper buffer layer, the at least one intermediate insulating layer, and the first gate insulating layer, and exposes the portion of the first semiconductor pattern comprises removing the upper buffer layer deposited in the non-display area and inorganic insulating layers deposited between the upper buffer layer and the substrate.

21. The method according to claim 14, wherein forming the second part of the first connection electrode connected to the first part of the first connection electrode through the second part of the second contact hole comprises forming a first source electrode and a first drain electrode connected to the second part of the first connection electrode, and a second source electrode and a second drain electrode connected to the second semiconductor pattern.

22. The method according to claim 14, wherein forming the second part of the first contact hole that passes through the interlayer insulating layer and the second gate insulating layer and exposes the first part of the first connection electrode comprises removing the interlayer insulating layer and the second gate insulating layer deposited on the substrate of the non-display area.

* * * * *